(12) United States Patent
Saidaminov et al.

(10) Patent No.: US 11,180,693 B2
(45) Date of Patent: Nov. 23, 2021

(54) LIGHT CONVERTING LUMINESCENT COMPOSITE MATERIAL

(71) Applicant: KING ABDULLAH UNIVERSITY OF SCIENCE AND TECHNOLOGY, Thuwal (SA)

(72) Inventors: Makhsud Saidaminov, Thuwal (SA); Yuhai Zhang, Jinan (CN); Jun Pan, Thuwal (SA); Ibrahim Dursun, Thuwal (SA); Omar Mohammed Abdelsaboor, Thuwal (SA); Osman Bakr, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 209 days.

(21) Appl. No.: 16/476,922

(22) PCT Filed: Jan. 11, 2018

(86) PCT No.: PCT/IB2018/050187
§ 371 (c)(1),
(2) Date: Jul. 10, 2019

(87) PCT Pub. No.: WO2018/146561
PCT Pub. Date: Aug. 16, 2018

(65) Prior Publication Data
US 2019/0330527 A1  Oct. 31, 2019

Related U.S. Application Data

(60) Provisional application No. 62/456,833, filed on Feb. 9, 2017.

(51) Int. Cl.
*C09K 11/66* (2006.01)
*C09K 11/02* (2006.01)
*H01L 33/50* (2010.01)

(52) U.S. Cl.
CPC ............ *C09K 11/665* (2013.01); *C09K 11/02* (2013.01); *H01L 33/504* (2013.01); *C01P 2004/62* (2013.01); *H01L 2933/0041* (2013.01)

(58) Field of Classification Search
CPC .............................. C09K 11/665; C09K 11/02
See application file for complete search history.

(56) References Cited

U.S. PATENT DOCUMENTS

| | | | | |
|---|---|---|---|---|
| 9,334,444 B1 * | 5/2016 | Yang | ...................... | G01T 1/2006 |
| 9,896,462 B1 * | 2/2018 | Ma | ........................ | H01L 51/005 |
| 2016/0225955 A1 * | 8/2016 | Chen | ...................... | H01L 33/385 |

OTHER PUBLICATIONS

Daqin Chen et al. Large-scale room-temperature synthesis and optical properties of perovskite-related Cs4PbBr6 fluorophores. Journal of Materials Chemistry C. 2016. pp. 10646-10653, vol. 4, Oct. 24, 2016.*

Andrey J. Zarur et al., "Reverse microemulsion synthesis of nanostructured complex oxides for catalytic combustion", Nature, Jan. 6, 2000, pp. 65-67, vol. 403.
Feng Zhang et al., "Brightly Luminescent and Color-Tunable Colloidal CH3NH3PbX3 (X=Br, I, Cl) Quantum Dots: Potential Alternatives for Display Technology", ACS Nano, 2015, pp. 4533-4542, vol. 9, No. 4.
Byunghong Lee et al., "Air-Stable Molecular Semiconducting Iodosalts for Solar Cell Applications: Cs2SnI6 as a Hole Conductor", Journal of the American Chemical Society, 2014, pp. 15379-15385, vol. 136.
David Battaglia et al., "Colloidal Two-Dimensional Systems: CdSe Quantum Shells and Wells", Angew. Chem. Int. Ed., 2003, pp. 5035-5039, vol. 42.
Francisco Palazon et al., "Polymer-Free Films of Inorganic Halide Perovskite Nanocrystals as UV-to-White Color-Conversion Layers in LEDs", Chemistry of Materials, 2016, pp. 2902-2906, vol. 28.
Georgian Nedelcu et al., "Fast Anion-Exchange in Highly Luminescent Nanocrystals of Cesium Lead Halide Perovskites (CsPbX3, X=Cl, Br, I)", Nano Letters, 2015, pp. 5635-5640, vol. 15.
Gregory D. Scholes et al., Excitons in nanoscale systems, Nature Materials, Sep. 2006, pp. 683-697, vol. 5.
Jacob B. Hoffman et al., "Transformation of Sintered CsPbBr3 Nanocrystals to Cubic CsPbI3 and Gradient CsPbBrxI3-x through Halide Exchange", Journal of the American Chemical Society, 2016, pp. 8603-8611, vol. 138.
M. Nikl et al., "Luminescence of CsPbBr3-like quantum dots in CsBr single crystals", Physica E, 1999, pp. 323-331.
M. Nikl et al., "Optical properties of Pb2+-based aggregated phases in CsBr Thin film and single crystal matrices", Radiation Effects and Defects in Solids, 1999, pp. 341-345, vol. 150, Nos. 1-4.
Makhsud I. Saidaminov et al., "Pure Cs4PbBr6: Highly Luminescent Zero-Dimensional Perovskite Solids", ACS Energy Letters, 2016, pp. 840-845, vol. 1.
Michael M. Adachi et al., "Microsecond-sustained lasing from colloidal quantum dot solids", Nature Communications, Oct. 23, 2015, pp. 1-8.
Michael R. Krames et al., "Status and Future of High-Power Light-Emitting Diodes for Solid-State Lighting", Journal of Display Technology, Jun. 2007, pp. 160-175, vol. 3, No. 2.
Michaela Meyns et al., "Polymer-Enhances Stability of Inorganic Perovskite Nanocrystals and Their Application in Color Conversion LEDs", ACS Applied Materials & Interfaces, 2016, pp. 19579-19586, vol. 8.
Nikolay S. Makarov et al., "Spectral and Dynamical Properties of Single Excitons, Biexcitons, and Trions in Cesium-Lead-Halide Perovskite Quantum Dots", Nano Letters, 2016, pp. 2349-2362, vol. 16.
P. Dey et al., "Origin of the temperature dependence of the band gap of PbS and PbSe quantum dots", Solid State Communications, 2013, pp. 49-54, vol. 165.
Quinten A. Akkerman et al., "Tuning to Optical Properties of Cesium Lead Halide Perovskite Nanocrystals by Anion Exchange Reactions", Journal of the American Chemical Society, 2015, pp. 10276-10281, vol. 137.
Xiaoming Li et al., "CsPbX3 Quantum Dots for Lighting and Displays: Room-Temperature Synthesis, Photoluminescence Superiorities, Underlying Origins and White Light-Emitting Diodes", Adv. Funct. Mater., 2016, pp. 2435-2445, vol. 26.

(Continued)

*Primary Examiner* — C Melissa Koslow
(74) *Attorney, Agent, or Firm* — Patent Portfolio Builders PLLC

(57) ABSTRACT

Described herein are compositions and methods relating to light converting luminescent Zero-D perovskite composite materials.

20 Claims, 24 Drawing Sheets

(56) References Cited

OTHER PUBLICATIONS

Yevgeny Rakita et al., "Low-Temperature Solution-Grown CsPbBr Single Crystals and Their Characterization", Crystal Growth & Design, Aug. 22, 2016, pp. 1-23.
Younghoon Kim et al., "Efficient Luminescence from Perovskite Quantum Dot Solids", Applied Materials & Interfaces, 2015, pp. 25007-25013, vol. 7.
Yunhua Yang et al., "Coating Aqueous Quantum Dots with Silica via Reverse Microemulsion Method: Toward Size-Controllable and Robust Fluorescent Nanoparticles", Chem. Mater., 2007, pp. 4123-4128, vol. 19.
Chen, D., et al., "Large-Scale Room-Temperature Synthesis and Optical Properties of Perovskite-Related $Cs_4PbBr_6$ Fluorophores," Journal of Materials Chemistry C, Materials for Optical and Electronic Devices, Jan. 1, 2016, vol. 4, No. 45, pp. 10646-10653.
Donker, H., "On the Luminescence of $Te^{4+}$ IN $A_2ZrCl_6$ (A=Cs, Rb) and $A_2SnCl_6$ (A=Cs, Rb, K)," J. Phys. Chem. Solids, Jan. 1, 1989, vol. 50, No. 6, pp. 603-609.
International Search Report in corresponding/related International Application No. PCT/IB2018/050187, dated Mar. 22, 2018.
Leng, M., "Synthesis and Optical Properties of Lead-Free Methylamine Bismuth Halide Perovskite Quantum Dots," Asia Communications and Photonics Conference (ACP) 2016, Jan. 1, 2016, pp AS1I.5.
Written Opinion of the International Searching Authority in corresponding/related International Application No. PCT/IB2018/050187, dated Mar. 22, 2018.

\* cited by examiner

No photoluminescence emits green light

LIGHT CONVERTING LUMINESCENT COMPOSITE MATERIAL

CROSS-REFERENCE TO RELATED APPLICATIONS

This application is a U.S. National Stage Application of International Application No. PCT/IB2018/050187, filed on Jan. 11, 2018, which claims priority and benefit of U.S. Provisional Application 62/456,833, filed Feb. 9, 2017, the entire contents of which are incorporated herein by reference.

TECHNICAL FIELD

The present disclosure generally relates to light converting luminescent composite materials.

BACKGROUND

Light Emitting Diodes (LEDs) are very important in Solid State Lighting (SSL) and are largely utilized in general indoor and outdoor lighting, automobile lighting, and backlighting for Liquid Cristal Displays (LCD). Because light from LEDs is monochromatic, in order to generate a combination of light of different wavelengths, for example white light, photoluminescent materials (or combinations of) and materials that can convert wavelengths of light are needed. Rare-earth phosphors are an example of a material that works as light converters. They mostly are placed on the top of LED whereas the entire light or the part of light from LED is absorbed by luminescent materials that then re-emit light of longer wavelengths. However there are still drawbacks using rare-earth phosphors. Lack of emission wavelengths tunability, broad Full Width at Half Maximum (FWHM) and presence of several emission peaks lead to poor color control and color rendering.

More recently, new types of materials were proposed as light converters—Quantum Dots. Quantum dots (QDs) are small semiconducting nanoparticles with diameters in the range of 2-15 nm that demonstrate improved luminescent properties due to quantum confinement because of small particle sizes. But because of small nanoparticles sizes there are some drawbacks to using them in solid state lighting. For example, they can aggregate during utilization because of small distances between particles, resulting in a drop of photoluminescence quantum yield (PLQY) up to ten times and shifting of emission peaks. Accordingly, there is a need to address the aforementioned deficiencies and inadequacies.

SUMMARY

The present disclosure provides composite materials and methods of making the composite materials for use in LED/LCD applications and that overcome the aforementioned deficiencies and inadequacies. In an embodiment a composite material is provided for LED/LCD applications. The composite material can comprise: Zero-D Perovskite particles encapsulated in a polymer, wherein the material absorbs a first wavelength of light and emits light with a second wavelength, wherein the second wavelength is longer than the first.

In any one or more aspects, the polymer can be selected from the group consisting of: polyurethanes, latex rubbers, silicone rubbers, other rubbers, polyvinylchloride (PVC), vinyl polymers, polyesters, polyacrylates, polyamides, biopolymers, polyolefines, thermoplastic elastomers, styrene block copolymers, and polyether block amide. The Zero-D Perovskite particles can be of the formula $A_4BX_6$, wherein A is a monovalent organic cation, an inorganic cation, or mixtures thereof; wherein B is a divalent cation; and X is $Cl^-$, $Br^-$, $I^-$, $CH_3COO^-$, or mixtures thereof; A can be $Cs^+$, $Rb^+$, $CH_3NH_3^+$, or $HC(NH_2)_2^+$, or B can be $Pb^{2+}$, $Sn^{2+}$, or $Ge^{2+}$, or both. The Zero-D Perovskite can be of the formula: $A_3B_2X_9$, wherein A is a monovalent organic cation, an inorganic cation, or mixtures thereof; B is a trivalent cation; and X is $Cl^-$, $Br^-$, $I^-$, $CH_3COO^-$ or mixtures thereof; A can be $Cs^+$, $Rb^+$, or $CH_3NH_3^+$, or $HC(NH_2)_2^+$, or B can be $Bi^{3+}$ or $Sb^{3+}$, or both. The Zero-D Perovskite can be of the formula: $A_2BX_6$, where A is a monovalent organic cation, an inorganic cation, or mixtures thereof; B is a tetravalent cation; and X is $Cl^-$, $Br^-$, $I^-$, $CH_3COO^-$ or mixtures thereof; A can be $Cs^+$, $Rb^+$, $CH_3NH_3^+$, or $HC(NH_2)_2^+$, or B can be $Sn^{4+}$, or both. The Zero-D Perovskites particles can be about 2 nm to about 5 mm in size. In one application, particles having a size of about 2 nm to about 200 nm are capped by ligands. The ligands can be selected from the group consisting of: long chain carboxylic acids, carboxylates, trioctylphosphines, trioctylphosphine oxides, amines, thiols, sulfates, sulfonates, and phosphates. The Zero-D Perovskite particles can emit light with FWHM of less than 25 nm and PLQY of the composite material can be more than 40%. The composite material can be a thin film.

In any one or more aspects of the composite material a Rare-Earth activated Phosphor can be encapsulated in the polymer. The Rare-Earth activated Phosphor can be selected from the group comprising: oxides, nitrides, oxynitrides, sulfides, oxysulfides, selenides, halides, oxyhalides, silicates, alum inates, fluoride, phosphates, garnets and scheelites containinq cerium, dysprosium, erbium, europium, gadolinium, holmium, lanthanum, lutetium, neodymium, praseodymium, promethium, samarium, scandium, terbium, thulium, ytterbium and yttrium. Quantum Dots can be encapsulated in the polymer. The Quantum Dots can be selected from the group comprising: CdSe, CdSe/ZnS, CdSe/ZnSe, CdSe/CdS, InP, InP/ZnS, InP/ZnSe, PbS, PbSe, PbSe/PbS, CdTe, CdTe/ZnS, CdTe/CdSe, and $ABX_3$ (where A is $Cs^+$, $Rb^+$, $CH_3NH_3^+$, $HC(NH_2)_2^+$ or mixtures thereof, B is $Pb^{2+}$, $Sn^{2+}$, or $Ge^{2+}$, X is $Cl^-$, $Br^-$, $I^-$ or mixtures thereof).

Other systems, methods, features, and advantages of the present disclosure for compositions and methods relating to luminescent structures, will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
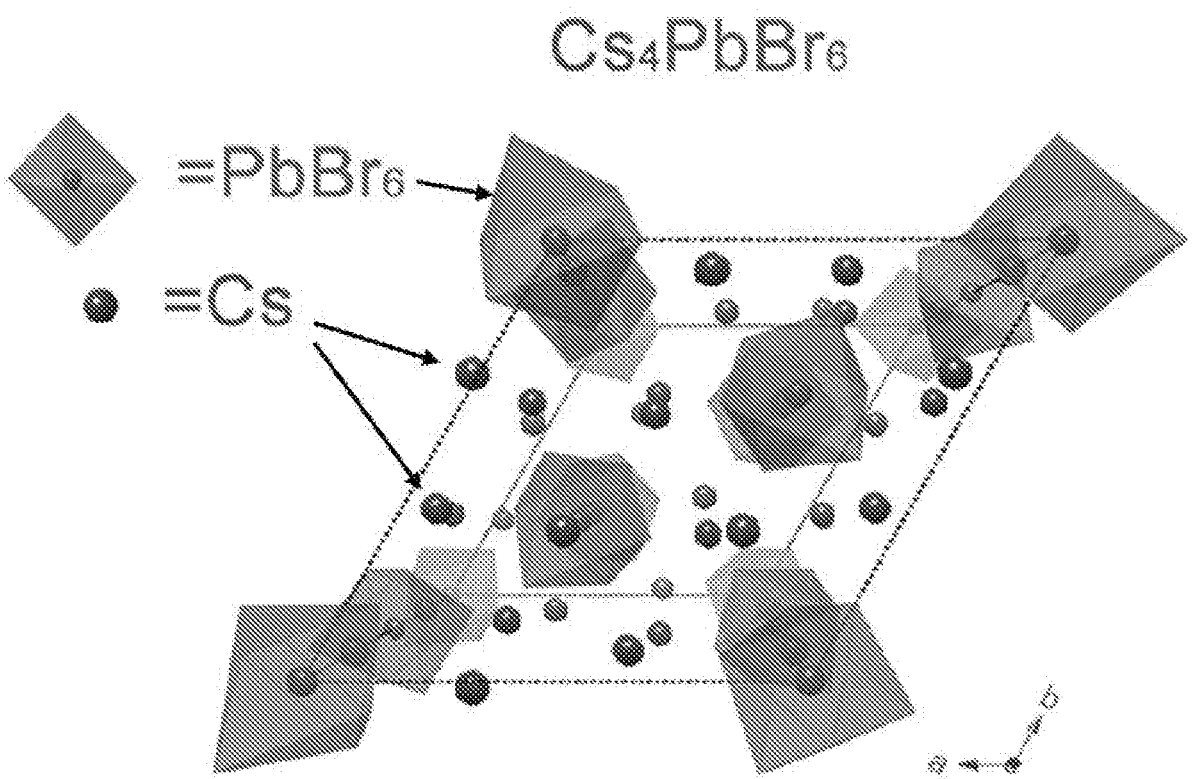
FIG. 1 is a crystal structure of an embodiment of a cesium lead bromide Zero-D perovskite with a $Cs_4PbBr_6$ structure featuring isolated $PbBr_6^{4-}$ octahedral.

Described below are various embodiments of compositions and methods relating to light converting luminescent composite materials. Although particular embodiments are described, those embodiments are mere exemplary implementations of the system and method. One skilled in the art will recognize other embodiments are possible. All such embodiments are intended to fall within the scope of this disclosure. Moreover, all references cited herein are intended to be and are hereby incorporated by reference into this disclosure as if fully set forth herein. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure.

DISCUSSION

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of sample preparation, analytical chemistry, chemical analysis, chemical synthesis, materials science, and the like, which are within the skill of the art. Such techniques are explained fully in the literature.

It is to be understood that, unless otherwise indicated, the present disclosure is not limited to particular types of compositions and methods relating to light converting luminescent composite materials, particular subjects (e.g. human, animal, plant or inanimate), and particular software[s] for post-processing and analysis, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

DESCRIPTION

The present disclosure is directed to light converting luminescent composite materials.

Light Emitting Diodes (LEDs) have become very important in Solid State Lighting (SSL). They are largely utilized in general indoor and outdoor lighting, automobile lighting and backlighting for Liquid Cristal Displays (LCD). LEDs are semiconductor devices that emit visible light when an electric current passes through them. The output from an LED can range from blue-violet (at a wavelength of approximately 400 nanometers) to far-red (about 700 nanometers) depending on the semiconducting material. For example, for blue light GaN or InGaN are used; for green: GaP or AlGaInP; for red: AlGaAs or GaAsP. Because light from LEDs is monochromatic, to generate the combination of lights, for example white light, photoluminescent materials (rare-earth phosphors) are needed. Rare-earth phosphors work as light converters and mostly are placed on the top of LED whereas the entire light or the part of light from LED is absorbed by luminescent materials that then re-emit light of longer wavelengths. For example for white light illumination two approaches are used. The first approach is using blue LED with yellow luminescent material on the top. The combination of blue and yellow lights generates white light. A common yellow rare-earth phosphor material used in this way is cerium-doped yttrium aluminium garnet ($Ce^{3+}$:YAG). A second approach is using blue LED with green and red phosphors to generate white light. Phosphor materials are mostly silicates, aluminates of phosphides with rare-earth metals like Ce, Eu etc. [1].

However there are drawbacks using rare-earth phosphors. Lack of emission wavelengths tunability, broad Full Width at Half Maximum (FWHM) and presence of several emission peaks lead to poor color control and color rendering.

Recently, new types of materials were proposed as light converters—Quantum Dots. Quantum dots (QDs) are small semiconducting nanoparticles with diameters in the range of 2-15 nm that demonstrate improved luminescent properties due to quantum confinement because of small particle sizes. The uniqueness of their luminescent properties is that the wavelengths of emission light can be precisely tuned by changing of nanoparticle sizes or composition. QDs show promise as light converting materials in backlighting units for LCDs, for white light generation, in special lighting for agriculture and medical applications. Compared with rare-earth phosphor materials, QDs possess narrower FWHM (<40 nm), higher brightness, higher photoluminescence quantum yield (PLQY) in colloidal form, and emission wavelength tunability through entire visible and near IR range [2].

Because of small nanoparticles sizes there are drawbacks to using QDs in solid state lighting. For example, they can aggregate during utilization because of small distances between particles, resulting in a drop of PLQY up to ten times and shifting of emission peaks [2].

Most recently, other novel types of materials have been proposed that demonstrate superior luminescent properties because of quantum confinement, but also have a crystal structure instead, so called Zero-dimensional perovskites [3]. Zero-dimensional perovskites (Zero-D perovskites) can have a common formula $A_4BX_6$, where A can be $Cs^+$, $Rb^+$, $CH_3NH_3^+$, or $HC(NH_2)_2^+$, and other monovalent organic or inorganic cations or their mixtures, $B=Pb^{2+}$, $Sn^{2+}$, $Ge^{2+}$ or other divalent cation, and X is $Cl^-$, $Br^-$, $I^-$, $CH_3COO^-$ or their mixtures. They can adopt a Bergerhoff-Schmitz-Dumont crystal type structure, in which metal-anion octahedra are spatially confined. Zero-D perovskites can show an outstandingly high photoluminescence, even in solid form. For example, an embodiment of a Zero-D perovskite, Cesium Lead Bromide Zero-D Perovskite ($Cs_4PbBr_6$), has a quantum yield (PLQY) in solid form of more than 40% with narrow emission of green light with the peak at 520 nm (an embodiment of a crystal structure shown in FIG. 1).

Zero-D Perovskites can exhibit a narrow emission peak, high PLQY, and exceptional stability, properties which make them very promising for light-to-light and electricity-to-light conversion technologies [3]. Other embodiments of Zero-D perovskites can have a common formula: $A_3B_2X_9$, where A can be $Cs^+$, $Rb^+$, $CH_3NH_3^+$, or $HC(NH_2)_2^+$, and other monovalent organic or inorganic cations or their mixtures, $B=Bi^{3+}$, $Sb^{3+}$ or other trivalent cation, and X is $Cl^-$, $Br^-$, $I^-$, $CH_3COO^-$ or their mixtures. Other embodiments of Zero-D perovskites can have a common formula: $A_2BX_6$, where A is $Cs^+$, $Rb^+$, $CH_3NH_3^+$, or $HC(NH_2)_2^+$, and other monovalent organic or inorganic cations or their mixtures, $B=Sn^{4+}$ or other tetravalent cation, and X is $Cl^-$, $Br^-$, $I^-$, $CH_3COO^-$ or their mixtures.

Figure 2:
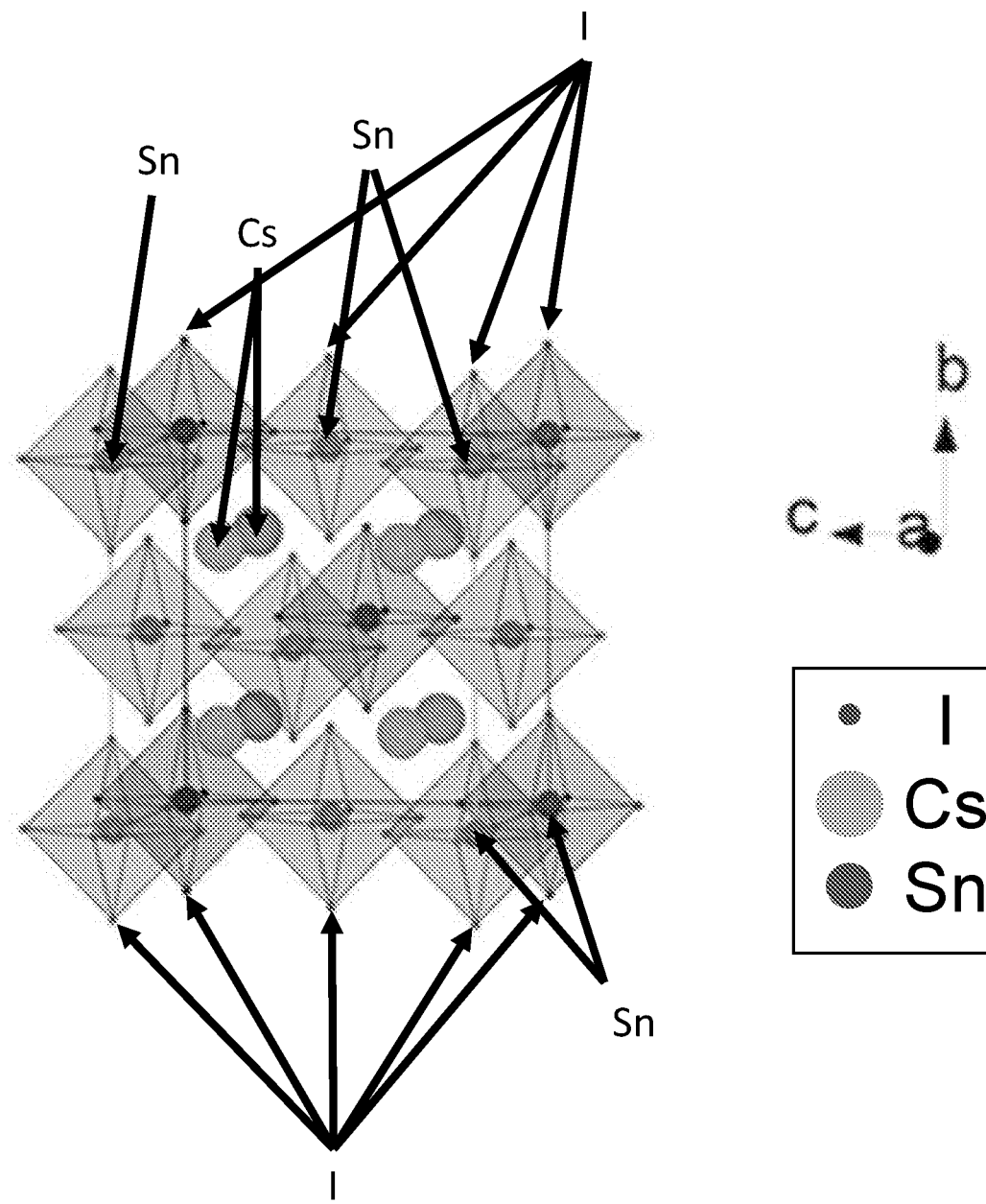
FIG. 2 is a crystal structure of an embodiment of a Cesium Tin Iodide Zero-D perovskite $Cs_2SnI_6$.

For example, in an embodiment a Zero-perovskite can be a Cesium Tin Iodide Zero-D Perovskite ($Cs_2SnI_6$), and can have a structure with isolated tin-halide octahedra [4] as shown in FIG. 2.

Figures 3A, 3B, 3C:
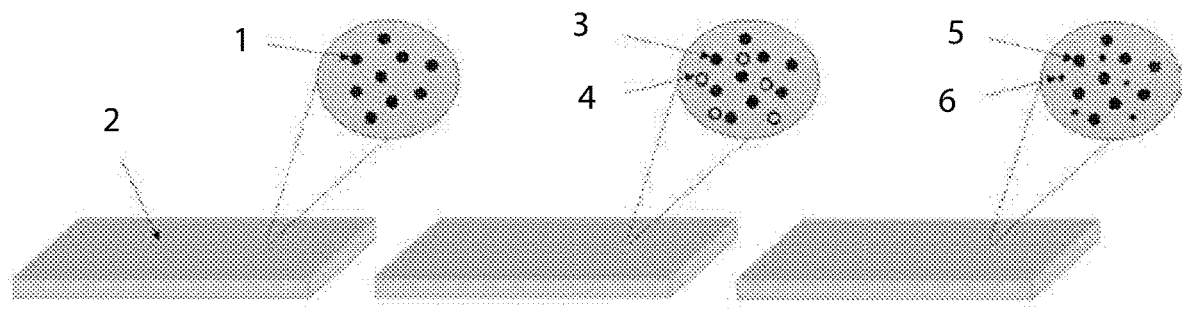
FIG. 3A depicts an embodiment of zero-dimensional (Zero-D) perovskites (1) in a polymer film (2).
FIG. 3B shows an embodiment of a polymer composite film with Zero-D perovskites (3) and rare-earth phosphors (4).
FIG. 3C illustrates an embodiment of a polymer composite film with Zero-D perovskites (5) and quantum dots (6).
Figure 3D:
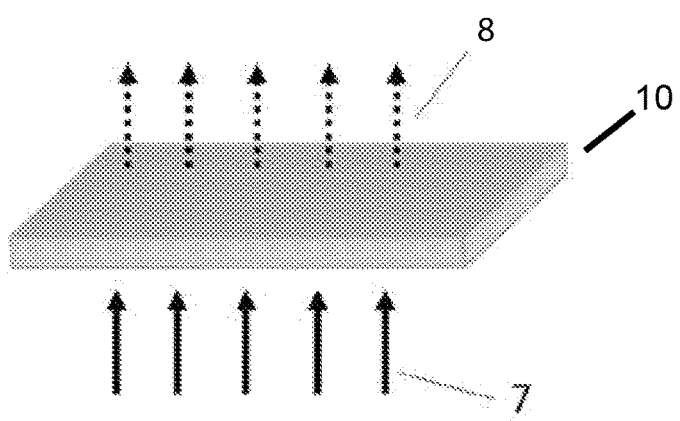
FIG. 3D demonstrates an embodiment of composite films as described herein absorbing light at a first wavelength (7) and re-emitting light at a second wavelength (8) which is longer than the first.

In various embodiments provided herein, Zero-D Perovskites can be successfully used as a light converting material in LCD, lighting and lasers applications. Zero-D Perovskites (with emission wavelengths $\lambda_{ZD}$) can be encapsulated into a host polymer, for example a polymer matrix, to form a Zero-D perovskite/polymer composite. The Zero-D perovskite/polymer composite can be used as a light converting composite. Examples of embodiments of light converting composites according to the present disclosure utilizing Zero-D perovskites can be seen in FIGS. 3A-3D. FIG. 3A depicts an embodiment of zero-dimensional (Zero-D) perovskites (1) in a polymer film (2). FIG. 3B shows an embodiment of a polymer composite film with Zero-D perovskites (3) and rare-earth phosphors (4). FIG. 3C illustrates an embodiment of a polymer composite film with Zero-D perovskites (5) and quantum dots (6). As shown in FIG. 3D, the composites 10 of the present disclosure under illumination of light with wavelengths $\lambda_I$ can absorb a first wavelength of light 7 and emit a second wavelength of light 8, wherein the second wavelength of light is longer than the first wavelength of light, thereby converting the absorbed light into light with longer wavelengths $\lambda_{ZD}$. Also such light converting composite additionally can contain rare-earth phosphors (with emission wavelengths $\lambda_{Ph}$) or quantum dots (with emission wavelengths $\lambda_{QD}$), or both.

For example, Zero-D Perovskites/Polymer composite or Zero-D Perovskites/Rare-earth Phosphors/Polymer composite or Zero-D Perovskites/Quantum Dots/Polymer with Blue LED as a light source can be used as a so called remote phosphor unit to generate white light. Blue LED (emission wavelength $\lambda_I$) with Zero-D Perovskites/Polymer composite can generate white light consisting of $\lambda_I$ and $\lambda_{ZD}$ wavelengths. Blue LED with Zero-D Perovskites/Rare-earth Phosphors/Polymer composite can generate white light consisting of $\lambda_I$, $\lambda_{ZD}$ and $\lambda_{Ph}$ wavelengths. Blue LED (emission wavelength $\lambda_I$) with Zero-D Perovskites/Quantum Dots/Polymer composite can generate white light consisting of $\lambda_I$, $\lambda_{ZD}$ and $\lambda_{QD}$ wavelengths.

Also these composites can be used as a backlighting unit of LCDs. The backlighting unit can consist of Blue LED as a light source and the Zero-D Perovskite/Polymer composite can emit light in green and red regions. The backlight unit can generate pure Red, Green and Blue lights that go to the LCD matrix and form the display image. For this purpose the Zero-D Perovskite/Polymer composite should contain Zero-D perovskites that emit light in green and red regions. Some of the perovskites in this composite can be replaced by rare-earth phosphors or quantum dots.

Also described herein are composite materials. Composite materials as described herein can be comprised of polymers. In certain embodiments, polymers as described herein can be polyurethanes, latex rubbers, silicon rubbers, other rubbers, polyvinylchloride (PVC), vinyl polymers, polyesters, polyacrylates, polyamides, biopolymers, polyolefines, thermoplastic elastomers, styrene block copolymers, polyether block amides, or others. Polymers as described herein can form thin films or other shapes, structures, or physical forms. Composite materials as described herein can absorb light at one wavelength and emit or pass light at a second wavelength, and the second wavelength can be longer than the first.

In certain embodiments, polymers as described herein can encapsulate light converting materials, light absorbing materials, light emitting materials, light reflecting materials, or other materials that can alter properties of incident light to make up or form the composite materials. In embodiments, the polymers can encapsulate Zero-D perovskites, Rare-Earth Phosphors, or Quantum dots, individually or in combination.

In an embodiment, the Zero-D perovskites are of the formula $A_4BX_6$. In certain embodiments, A can be a monovalent organic cation, an inorganic cation, or mixtures there. In embodiments, A can be $Cs^+$, $Rb^+$, $CH_3NH_3^+$, or $HC(NH_2)^{2+}$. In certain embodiments, B can be a divalent cation. In certain embodiments, B can be $Pb^{2+}$, $Sn^{2+}$, or $Ge^{2+}$. In certain embodiments, X can be $Cl^-$, $Br^-$, $I^-$, $CH3COO^-$, mixtures thereof, or other halogens.

In an embodiment, the Zero-D perovskites are of the formula $A_3B_2X_9$. In certain embodiments, A can be a monovalent organic cation, an inorganic cation, or mixtures there. In embodiments, A can be $Cs^+$, $Rb^+$, $CH_3NH_3^+$, or $HC(NH_2)^{2+}$. In certain embodiments, B can be a trivalent cation. In certain embodiments, B can be $Bi^{3+}$ or $Sb^{3+}$. In certain embodiments, X can be $Cl^-$, $Br^-$, $I^-$, $CH3COO^-$, mixtures thereof, or other halogens.

In an embodiment, the Zero-D perovskites are of the formula $A_2BX_6$. In certain embodiments, A can be a monovalent organic cation, an inorganic cation, or mixtures there. In embodiments, A can be $Cs^+$, $Rb^+$, $CH_3NH_3^+$, or $HC(NH_2)^{2+}$. In certain embodiments, B can be a tetravalent cation. In certain embodiments, B can be $Sn^{4+}$. In certain embodiments, X can be $Cl^-$, $Br^-$, $I^-$, $CH3COO^-$, mixtures thereof, or other halogens.

The Zero-D Perovskites can be about 2 nm to about 5 mm in size. A size as used herein can be a length, width, height, diameter, circumference, radius, volume, surface area, or other dimension. In embodiments, the Zero-D perovskites can be particles. In other embodiments, the Zero-D perovskites can have a size of about 2 nm to about 200 nm and be capped by ligands. In embodiments which are not intended to be limiting, ligands which can cap Zero-D perovskites can be long chain carboxylic acids, carboxylates, trioctylphosphines, trioctylphosphine oxides, amines, thiols, sulfates, sulfonates, and phosphates.

The Zero-D perovskites as described herein can be particles that emit light with FWHM of less than 25 nm. The Zero-D perovskites as described herein can be encapsulated in a polymer and be in a composite material with a PLQY of more than about 40%. The Zero-D perovskites as described herein can be in a colloidal suspension. In general, the Zero-D Perovskites can be formed or synthesized as described in application 62/380,131 (which corresponds to PCT/UB2017/055135), which is incorporated by reference as if fully set forth herein.

Other materials that can be encapsulated by polymers to form the composite materials as described herein can be Rare-Earth activated Phosphors or Quantum dots, individually or in combination. These materials can exist in the composite materials with the Zero-D perovskites such as those described above. In certain embodiments, the Rare-Earth activated phosphors can be oxides, nitrides, oxynitrides, sulfides, oxysuifides, selenides, halides, oxyhalides, silicates, alum inates, fluoride, phosphates, garnets and scheelites containing cerium, dysprosium, erbium, europium, gadolinium, holmium, lanthanum, lutetium, neodymium, praseodymium, promethium, samarium, scandium, terbium, thulium, ytterbium and yttrium. In certain embodiments, Quantum Dots can be CdSe, CdSe/ZnS, CdSe/ZnSe, CdSe/CdS, InP, InP/ZnS, InP/ZnSe, PbS, PbSe, PbSe/PbS, CdTe, CdTe/ZnS, CdTe/CdSe, $ABX_3$ (where A is $Cs^+$, $Rb^+$, $CH_3NH_3^+$, $HC(NH_2)_2^+$ or mixtures thereof, B is $Pb^{2+}$, $Sn^{2+}$, or $Ge^{2+}$, X is $Cl^-$, $Br^-$, $I^-$ or mixtures thereof). Combinations of materials as described herein can be tuned to produce light of one or more desired wavelengths by one skilled in the art.

EXAMPLES

Now having described the embodiments of the disclosure, in general, the examples describe some additional embodiments. While embodiments of the present disclosure are described in connection with the example and the corresponding text and figures, there is no intent to limit embodiments of the disclosure to these descriptions. On the contrary, the intent is to cover all alternatives, modifications, and equivalents included within the spirit and scope of embodiments of the present disclosure.

Example 1

Figure 4A:
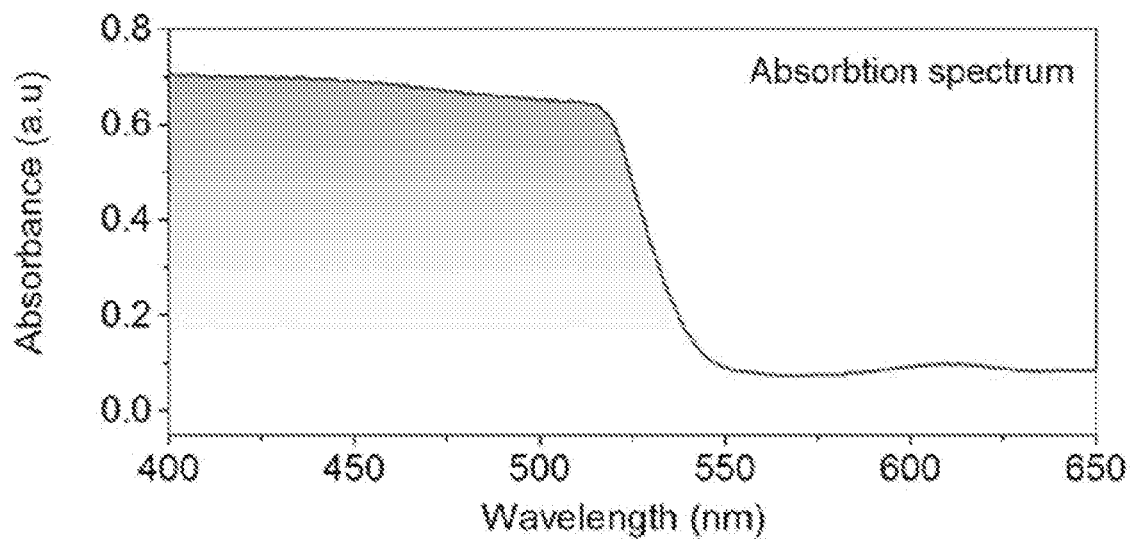
FIG. 4A illustrates the absorption spectra of an embodiment of solid $Cs_4PbBr_6$ excited at a wavelength of 365 nm.
Figure 4B:
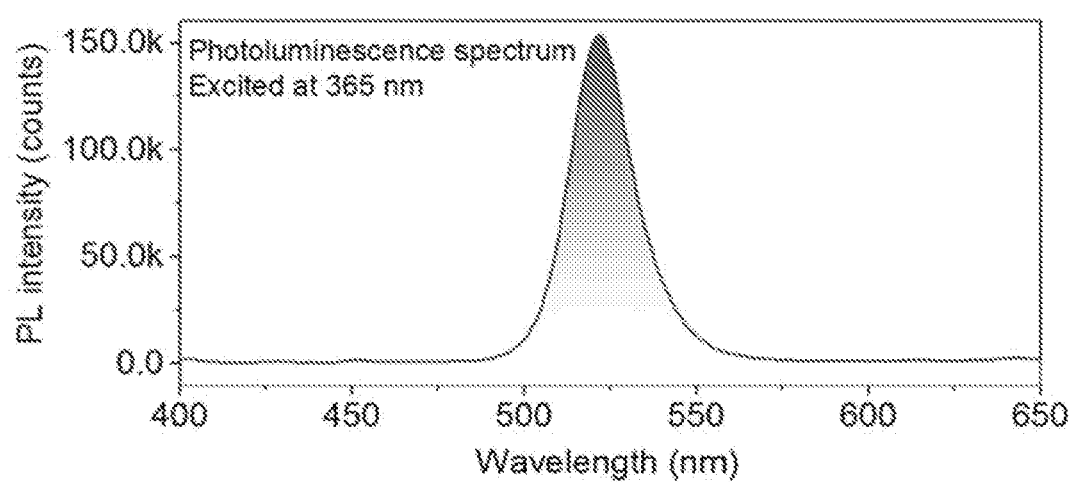
FIG. 4B depicts the photoluminescence (PL) spectra of an embodiment of $Cs_4PbBr_6$ excited at a wavelength of 365 nm.

Cesium Lead Bromide Zero-D Perovskite $Cs_4PbBr_6$ was synthesized according to [3]. This low-dimensional perovskite exhibits immense luminescent properties. The absorption spectrum of $Cs_4PbBr_6$ edges at 540 nm (FIG. 4A), and PL spectrum shows an emission peak at 520 nm (FIG. 4B). FWHM was found to be 20 nm and PLQY to be 40%.

Figure 5A:
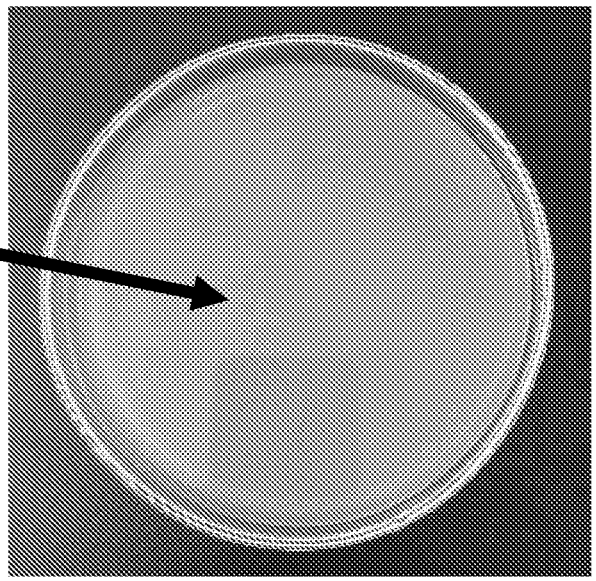
FIG. 5A depicts an embodiment of a Zero-D perovskite/PMMA composite material in a petri dish under ambient light.
Figure 5B:
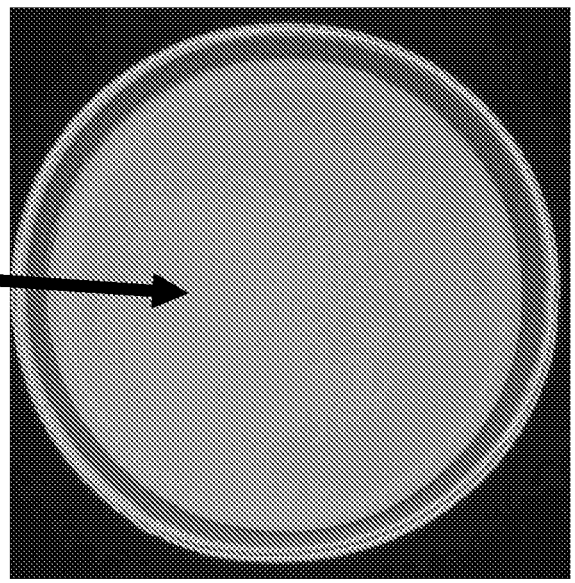
FIG. 5B depicts an embodiment of a Zero-D perovskite/PMMA composite material in a petri dish under ultraviolet (UV) light.

For Zero-D Perovskite $Cs_4PbBr_6$/Polymer composite preparation, 0.8 g of PMMA was dissolved in 12 mL of chloroform. Then 200 mg of Zero-D Perovskite was dispersed in chloroform solution at room temperature for 2 hours until obtaining uniform dispersion. Then the well-dispersed Zero-D solution was mixed together with PMMA solution for 2 hours. After that the liquid was poured into a flat bottom Petri Dish that was capped and kept for 24 hours at room temperature until fine film forming. The final film is a semi-transparent film with green shades (FIG. 5A). Under UV lamp the film shines in a green uniform color (FIG. 5B).

Figure 6:
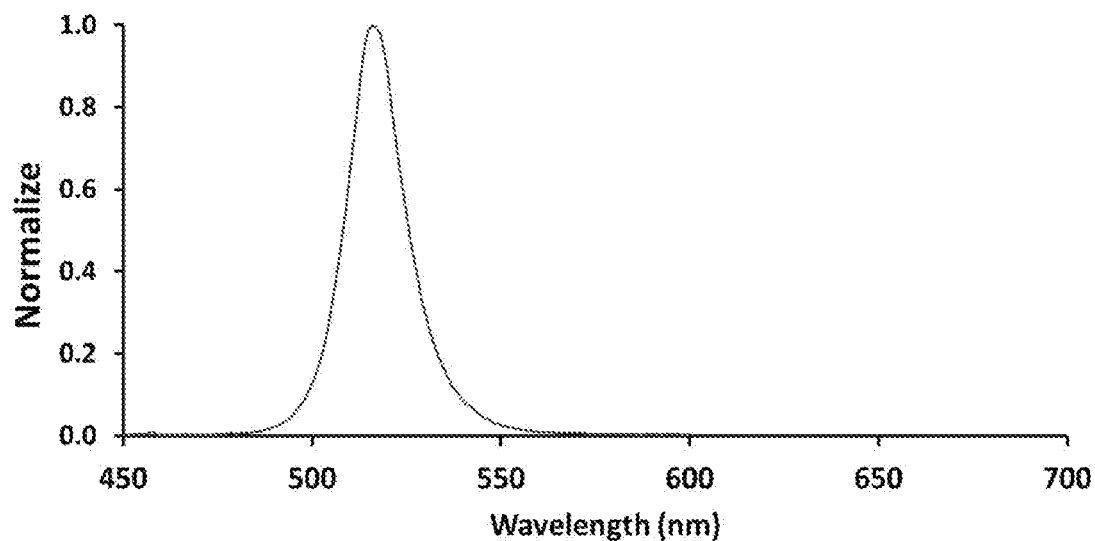
FIG. 6 depicts the photoluminescence (PL) spectra of an embodiment of a Zero-D perovskite $Cs_4PbBr_6$/Perovskite/PMMA composite excited at a wavelength of 365 nm.

The emission spectra measurements (FIG. 6) showed that the emission peak is 520 nm. Measurement of the PLQY of Zero-D perovskite was found to be remarkably high (>50%) and FWHM to be very narrow (19 nm). The unchanged emission peak and FWHM of Zero-D Perovskite material and surprisingly increased PLQY indicate the possibility to use them as light converting materials for LCD and lighting applications.

Example 2

Figure 7:
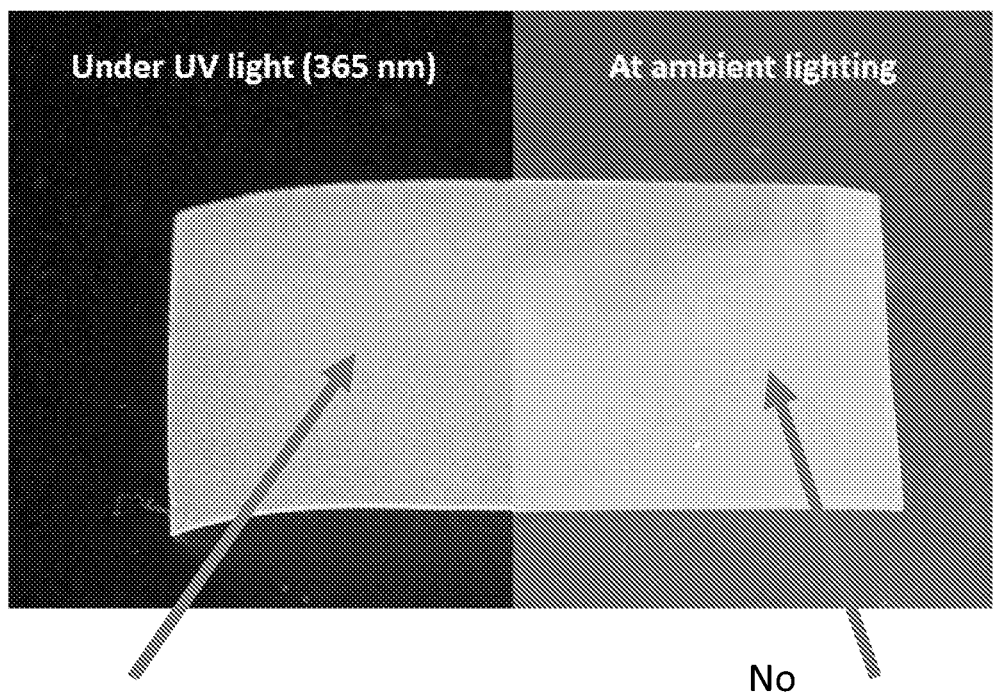
FIG. 7 is a photo of an embodiment of a composite film with PMMA, $Cs_4PbBr_6$, and red CdSe/CdS quantum dots (QDs) under UV light (left) and visible light (right).
Figure 8:
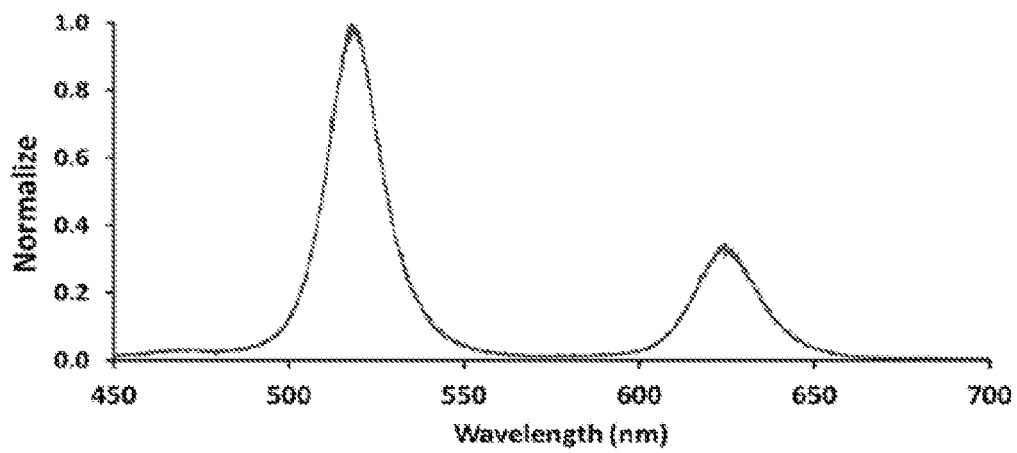
FIG. 8 demonstrates the photoluminescence spectra of an embodiment of a composite film with Zero-D perovskite $Cs_4PbBr_6$, red quantum dots, and PMMA excited at a wavelength of 365 nm.

Polymer composite with Zero-D perovskites and red quantum dots can be successfully used for backlighting system for LCD displays. For the preparation of such material, 1.8 g of PMMA was dissolved in 15 ml of chloroform. Then 15 mg of Zero-D Perovskite $Cs_4PbBr_6$ was dispersed in chloroform solution at room temperature for 2 hours until obtaining uniform dispersion. Then 1 mg of red CdSe/CdS quantum dots in toluene (synthesized as in [5]) was added to the solution. After that the well-dispersed solution was mixed together with PMMA solution for 2 hours. The final liquid was poured then into a flat bottom Petri Dish that was capped and kept for 24 hours at room temperature until fine film forming. The final film is a semi-transparent film with green shades under ambient lighting and with green-yellow illumination under UV (FIG. 7). The emission spectrum is presented in FIG. 8.

Emission peaks of the composite are 520 nm for Zero-D Perovskite and 620 nm for red quantum dots that are close to emissions peaks of commercial composite. Commercial composite was a polymer film inside Amazon Kindle Fire tablet that contains green and red cadmium selenide quantum dots, Table 1.

TABLE 1

| Sample | Emission peaks | FWHM |
| --- | --- | --- |
| Zero-D Perovskite/quantum dots/Polymer composite | Green - 520 nm<br>Red - 620 nm | Green - 20 nm<br>Red - 25 nm |
| Amazon Kindle Fire film | Green - 540 nm<br>Red - 610 nm | Green - 25 nm<br>Red - 40 nm |

Figure 9:
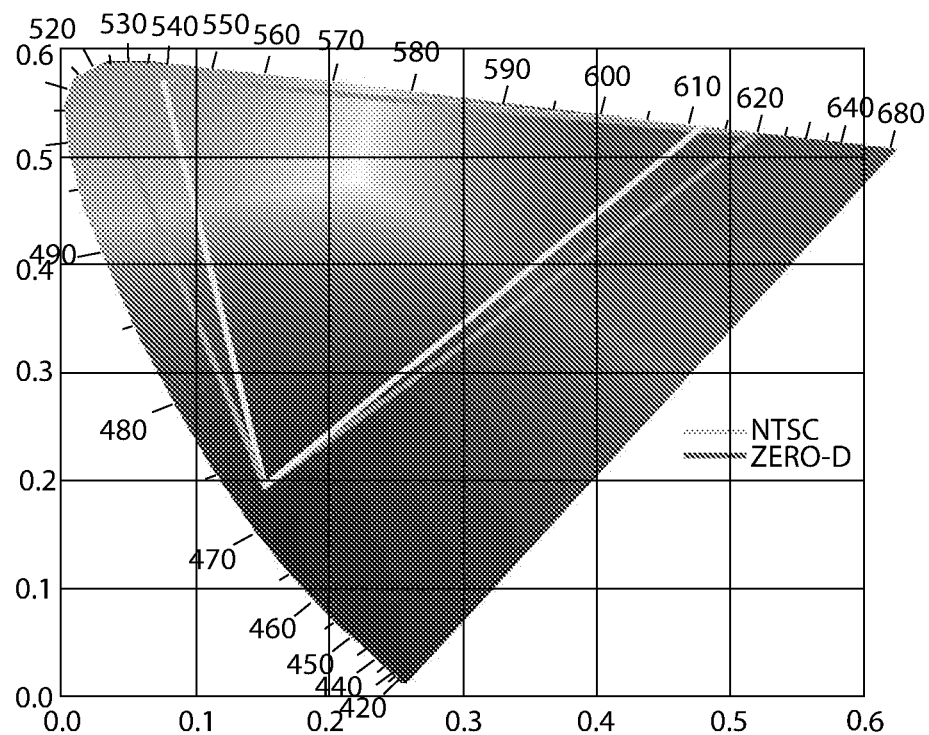
FIG. 9 is a CIE 1976 chromaticity diagram of an embodiment of a composite film with Zero-D perovskite $Cs_4PbBr_6$, red QDs, and PMMA.

Surprisingly FWHM of Zero-D perovskite green emission remains unchanged and equals 20 nm. That is narrower than for green emission of commercial composite and more beneficial for LCD applications. PLQY of this composite is 43%. Additionally, the composite has a very pure green color and the color gamut area is 124% of NTSC area (according to CIE 1976 Chromaticity Diagram (FIG. 9)):

As seen, Zero-D Perovskites can be successfully used as a replacement of green quantum dots. Additionally, Zero-D perovskite material has narrower FWHM what is crucial for using in LCD displays and will improve the quality of LCD image.

Example 3

Zero-D Perovskites material can be utilized as a remote phosphor in mixture with red rare-earth phosphor for white light generation. Zero-D Perovskite $Cs_4PbBr_6$ and market available red-emitting nitride phosphor (LAM-R-6237, Dalian Luming Group) were dispersed in PDMS. Dispersion was poured then into a flat bottom Petri Dish that was capped and kept for 12 hours at 60° C. temperature until solidification process is completed. Varying with concentration of Zero-D perovskite three film samples were obtained. See Table 2.

TABLE 2

| Sample | PDMS (g) | Zero-D Perovskite (g) | Red Phosphor (g) |
|---|---|---|---|
| A | 2.2 | 0.100 | 0.100 |
| B | 2.2 | 0.200 | 0.100 |
| C | 2.2 | 0.300 | 0.100 |

Figure 10A:
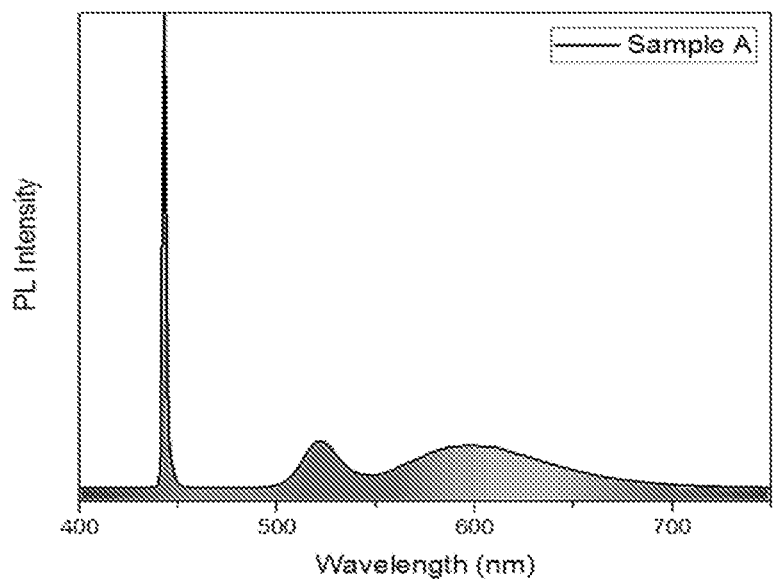
FIGS. 10A-10C illustrate photoluminescence spectra of 3 embodiments of Zero-D perovskite $Cs_4PbBr_6$/red Rare-Earth Phosphor/PMMA composite samples A (FIG. 10A), B (FIG. 10B), and C (FIG. 10C) respectively.
Figure 10B:
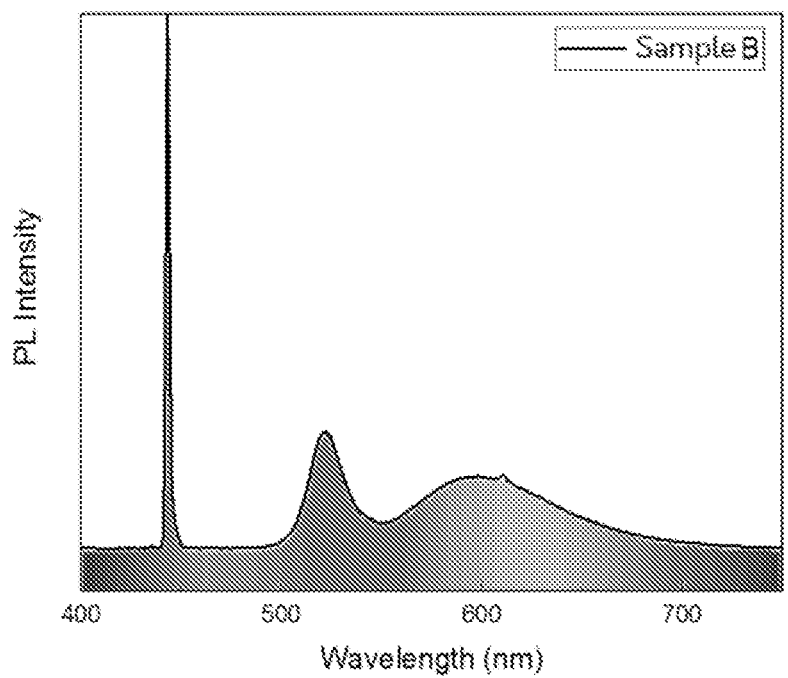
Figure 10C:
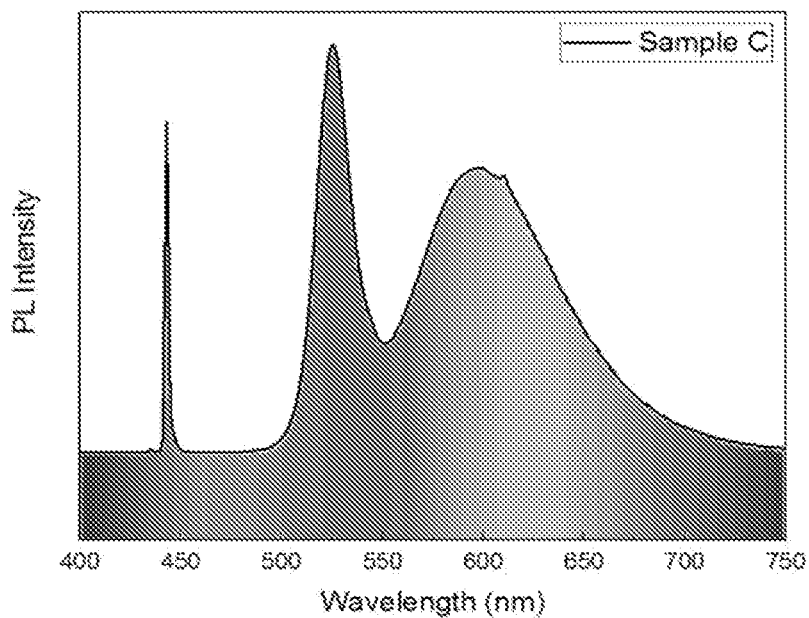

To study PL spectra, color rendering index (CRI) and correlated color temperature (CCT), these composites were excited by a GaN blue-emitting LD ($\lambda$=450 nm). The PL spectra are presented in FIG. 10A (sample A), FIG. 10B (sample B), and FIG. 10C (sample C), see Table 3.

Operating at 200 mA, this system generates a warm white light with high CRI values, as calculated after its emission passes through the composites.

TABLE 3

| Sample | CCT | CRI |
|---|---|---|
| A | 3709 | 83 |
| B | 3833 | 84 |
| C | 3411 | 81 |

Compared with the warm white LED bulbs available on the market, which have a typical CRI of 70-80 [6], the white light generated herein achieves higher quality emission which is essential factor for indoor illumination and optical display applications. That is due to narrow FWHM of emission and high PLQY of Zero-D Perovskite particles.

Example 4

Preparation of a Zero-D Perovskite Colloid (Aka Colloidal Zero-D Perovskite).

Preparation of the stable colloid or dispersion of Zero-D Perovskites in solvents facilitates the application in solution-processed fabrication of optoelectronics devices where the layers of luminescent materials are deposited by drop casting, blade casting, spin coating from stable colloidal solutions. Zero-D Perovskites Nanocrystals (NCs) with sizes 2-200 nm can form a stable colloids in solvents. The NCs can be capped by ligands to prevent agglomeration. Such ligands can be long chain carboxylic acids, carboxylates, trioctylphosphines, trioctylphosphine oxides, amines, thiols, sulfates, sulfonates, phosphates.

Herein, a reverse microemulsion method is provided for the first time to synthesize $Cs_4PbBr_6$ NCs with uniform size distribution around 26 nm. The method enables the selective generation of 0-D rhombohedral phase of $Cs_4PbBr_6$ NCs with 85% reaction yield. The nanocrystal exhibits 65% PLQY in colloidal form and an exceptional 54% PLQY in thin-film form that is surprisingly higher optical performance than in bulk materials. Optical characterizations of $Cs_4PbBr_6$ NCs reveal a bandgap of 2.37 eV, a bi-component PL lifetime of 1.6 ns and 9.1 ns, and an exciton binding energy of 114 meV.

$Cs_4PbBr_6$ NCs were synthesized through a modified reverse microemulsion method (FIG. 11A) [7]. Typically, a dimethylformamide (DMF) solution of $PbBr_2$, hydrogen bromide (HBr), oleic acid (OA) and oleylamine was injected into a n-hexane solution of cesium oleate and OA under vigorous stirring. The immiscible solvent nature of DMF and hexane leads to the formation of a reverse microemulsion system of an "oil" phase with hexane and an "aqueous" phase with DMF. Previous study has demonstrated that the nucleation of 0-D phase $Cs_4PbBr_6$ tends to occur at the interface of two solvents with large polarity disparity [7]. However, the nucleation rate was not controlled properly, resulting in an irregular morphology of $Cs_4PbBr_6$ particles.

Figure 11A:
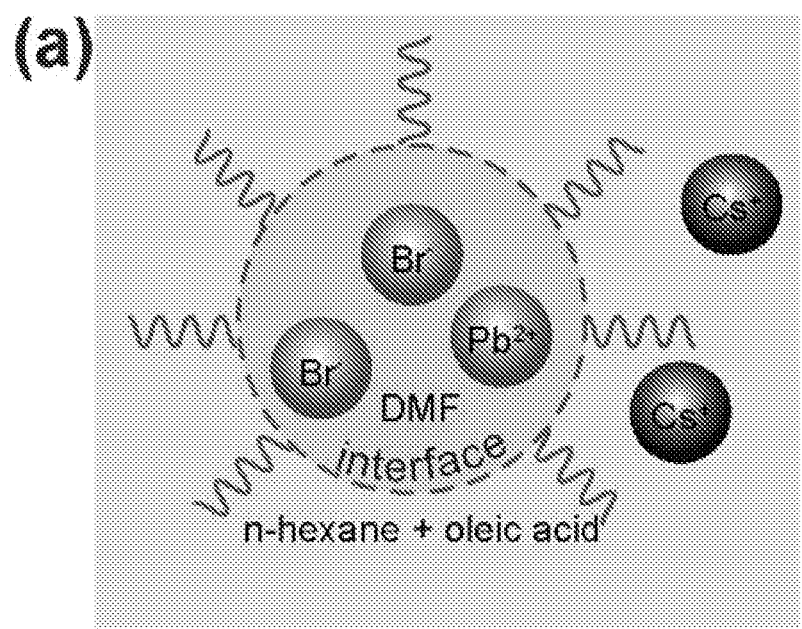
FIG. 11A is a schematic of an embodiment of a micelle structure for the reverse microemulsion comprising an "oil" phase with n-hexane and an "aqueous" phase with DMF; the $Cs_4PbBr_6$ nanocrystals (NCs) can be formed at the interface between the two phases. Note that OA can be used as a surfactant to stabilize the microemulsion.
Figure 11B:
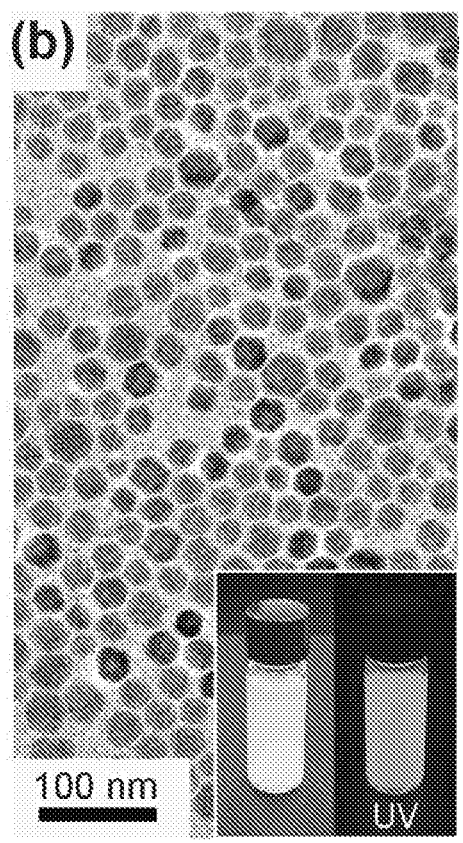
FIG. 11B is a transmission electron microscopy (TEM) image of an embodiment of $Cs_4PbBr_6$ NCs; the inset shows a photograph of the nanocrystal dispersion in hexane under ambient light (inset, left) and a UV lamp (inset, right) respectively.
Figure 11C:
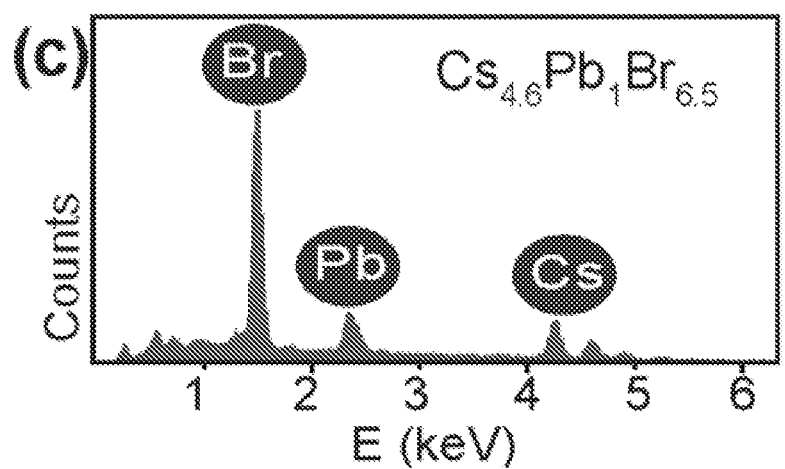
FIG. 11C is an energy-dispersive X-ray (EDX) spectrum of an embodiment of as-synthesized $Cs_4PbBr_6$ NCs, showing an elemental composition of $Cs_{4.6}Pb_1Br_{6.5}$.
Figure 11D:
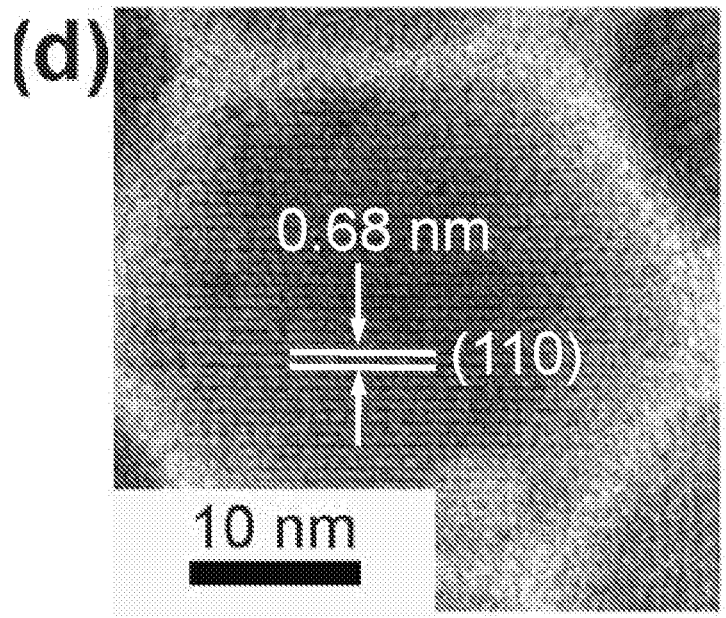
FIG. 11D is a high-resolution TEM (HR-TEM) of an embodiment of a single $Cs_4PbBr_6$ nanocrystal, showing clear lattice fringes corresponding to (110) facets.
Figure 11E:
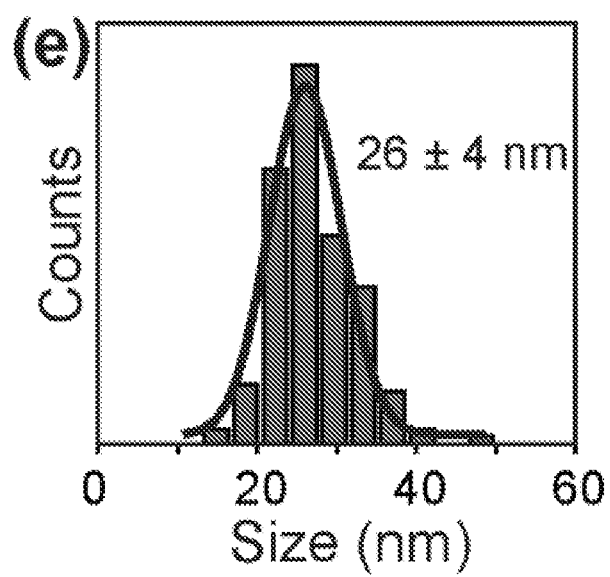
FIG. 11E shows a size distribution histogram of an embodiment of $Cs_4PbBr_6$ NCs, featuring a diameter of 26 nm.
Figure 11F:
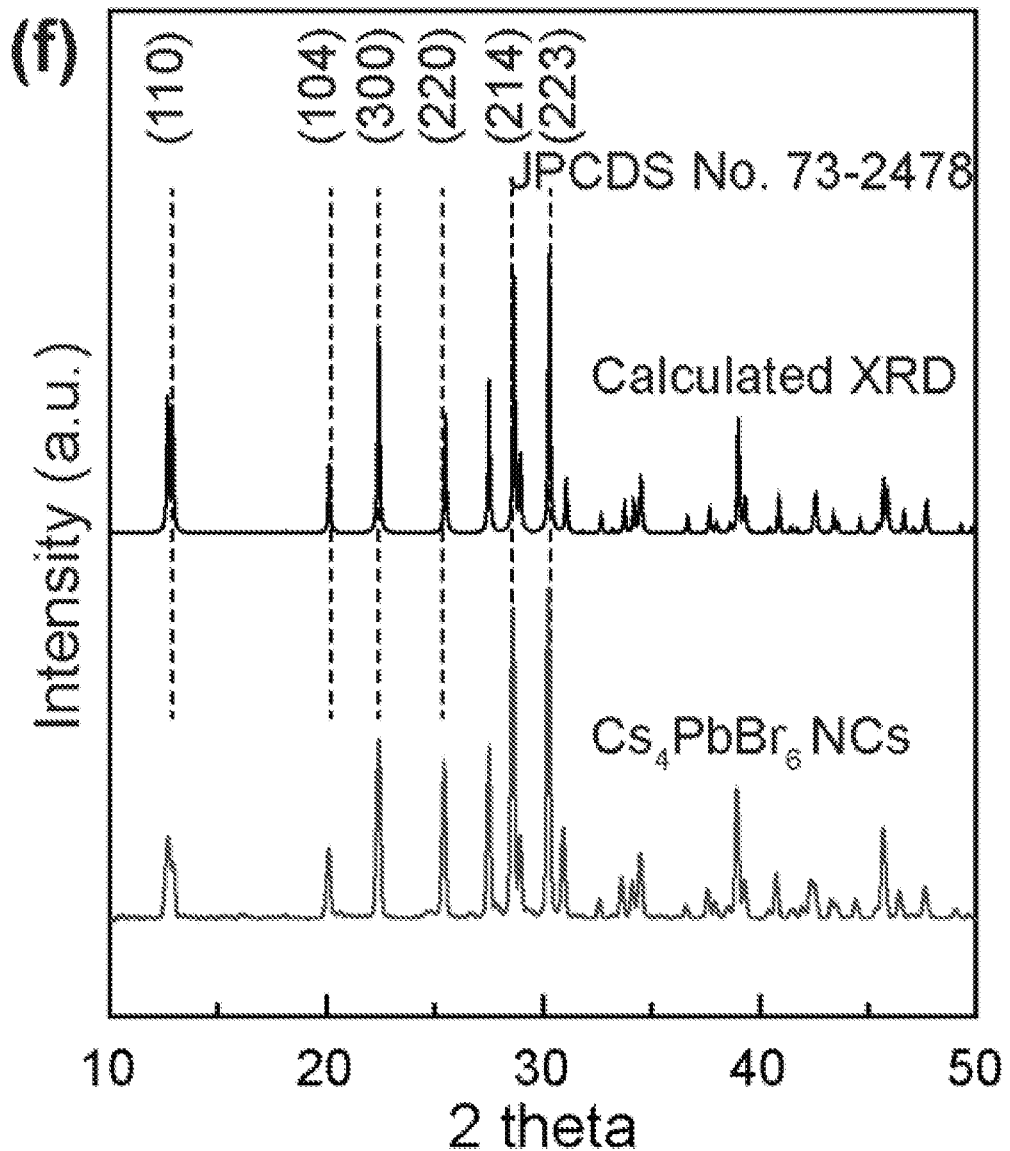
FIG. 11F is an x-ray diffraction (XRD) pattern of an embodiment of the as-prepared $Cs_4PbBr_6$ NCs, indeed to a centrosymmetric space group R-3c (167).

In order to impose a control over nucleation rate, the Pb-precursor and Cs-oleate were trapped in DMF and hexane separately (FIG. 11A). First, a mixture of 2.25 g of $Cs_2CO_3$ and 21.5 mL of OA was stirred and degassed at 130° C. under vacuum for 1 hour to generate a yellowish stock of Cs-oleate precursor. Second, 0.2 mL Cs-oleate precursor, 10 mL n-hexane, 5 mL OA were loaded in a 50-mL three-neck flask, followed by mild degassing and nitrogen purging. Third, into the flask, a mixture of $PbBr_2$ (0.03 M, DMF, 1 mL), HBr (48 wt %, 15 mL), 0.1 mL OA, and 0.05 mL OLA was swiftly injected under vigorous stirring. The nucleation rate is then limited by the slow release of $Cs^+$ ions from Cs-oleate complex. A color change from pale-white to green was observed in 10 min, suggesting the formation of $Cs_4PbBr_6$ nanocrystals. The as-synthesized nanocrystals were collected via centrifugation at 8000 rpm for 3 min (one-centrifugation-only purification process), followed by dispersion in 2 mL of toluene for further characterization. Indeed, $Cs_4PbBr_6$ NCs were obtained with narrow size distribution around 26±4 nm (FIG. 11B AND FIG. 11E). Energy-dispersive X-ray spectrum (EDX) measurement shows the elemental ratio of Cs/Pb/Br is about 4.6:1:6.5 (FIG. 11C). The excessive CsBr component indicates that the surface dangling moiety of $Cs_4PbBr_6$ NCs is likely CsBr, which is in agreement with previous report [7]. High-resolution transmission electron microscopy (HR-TEM) image reveals the single-crystal nature of the obtained $Cs_4PbBr_6$ NCs (FIG. 11D). Moreover, X-ray diffraction (XRD) pattern of $Cs_4PbBr_6$ NCs shows a pure rhombohedral phase in space group R-3c (167) (FIG. 11F).

Figure 18:
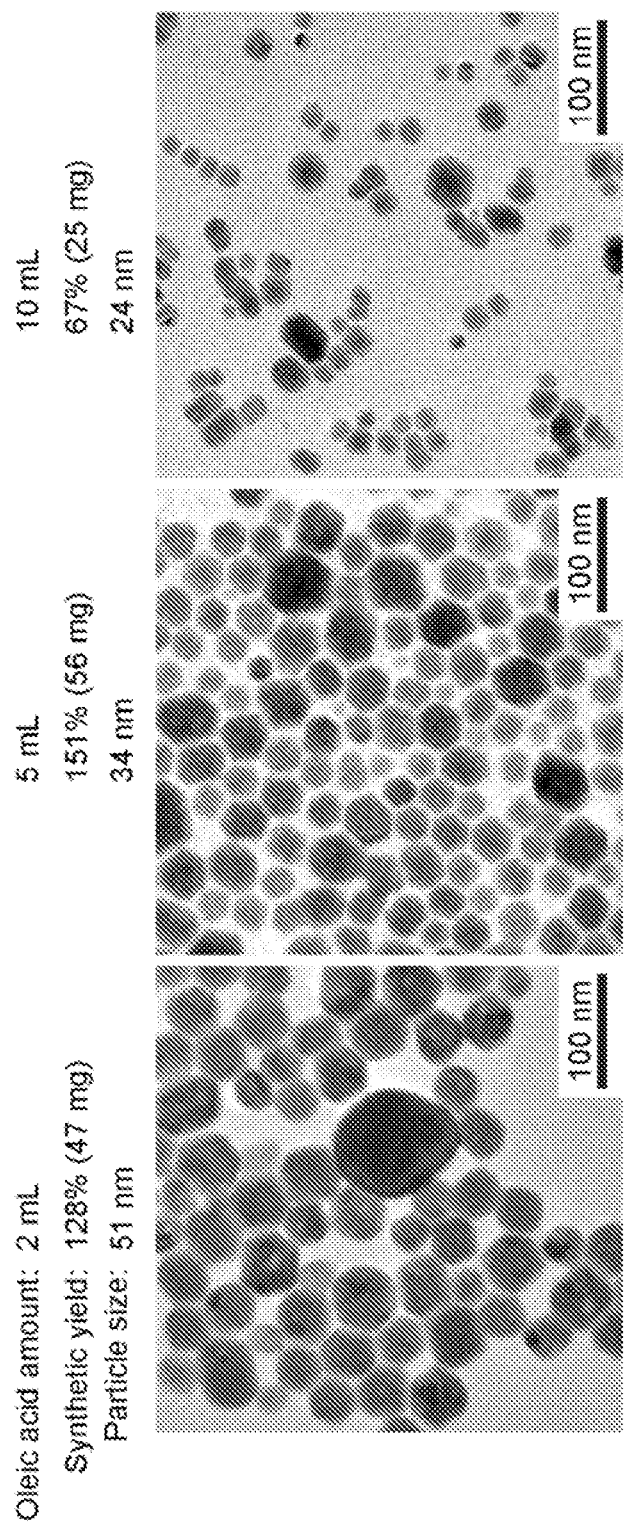
FIG. 18 shows TEM images of embodiments of $Cs_4PbBr_6$ NCs synthesized with varied amounts of oleic acid (2, 5, 10 mL). The corresponding yield and average particle size are also listed.
Figure 22:
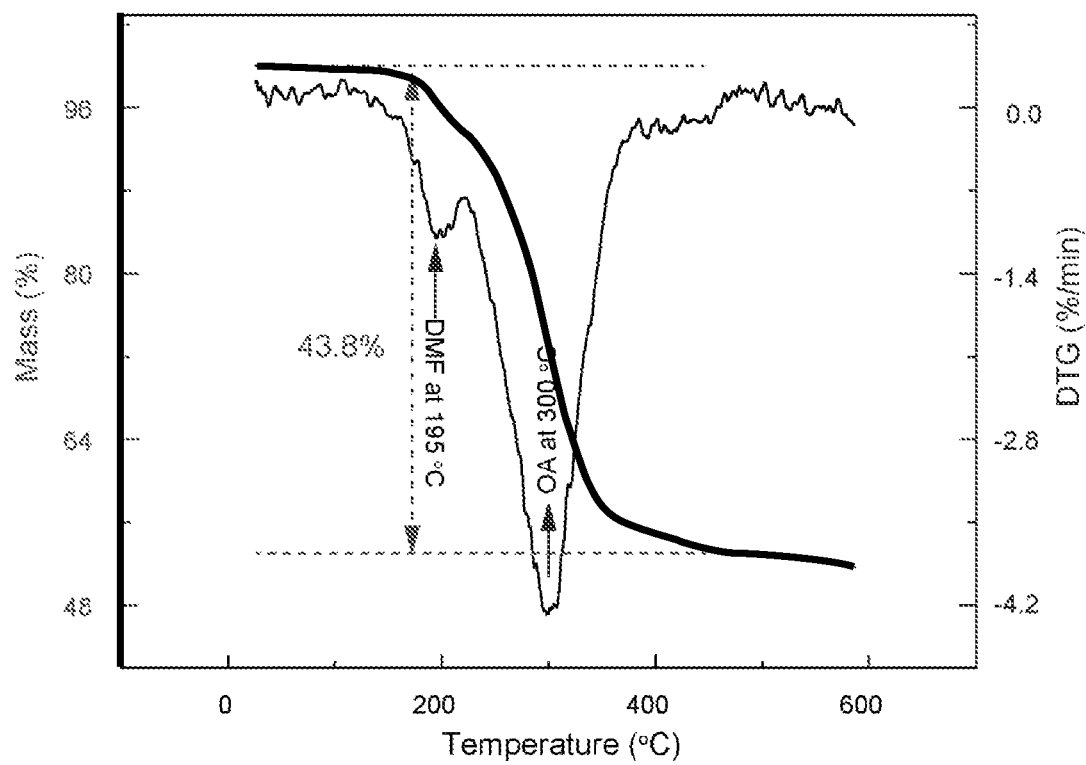
FIG. 22 shows thermogravimetric analysis (TGA) and difference thermogravimetric (DTG) measurements of reactions as described herein.

It is worth noting that micelle size will determine the particle size of $Cs_4PbBr_6$ [8,9]. In order to tune the micelle size, varied amounts of OA were used to stabilize the microemulsion (FIG. 18). Indeed, increasing amount of OA (2, 5, 10 mL) leads to a stable microemulsion system without phase-separation even after centrifugation, and an ensuing decrease of particle size. Interestingly, we found an unordinary synthetic yield of 151% (56 mg in a typical synthesis after centrifugation) with optimal amount of OA (5 mL). Thermogravimetric analysis (TGA) and difference thermogravimetric (DTG) measurements show that 43.8 wt % of the final product come from the tethering ligands OA (37.9%) or leftover solvent DMF (5.9%), suggesting a reaction yield of 85% (FIG. 22). The abundant hydrophobic ligands on NC surface enable a stable dispersion of colloidal in non-polar solvents such as hexane and toluene. To avoid the loss of ligands in purification process, a one-round-centrifugation procedure can be used.

Figure 12A:
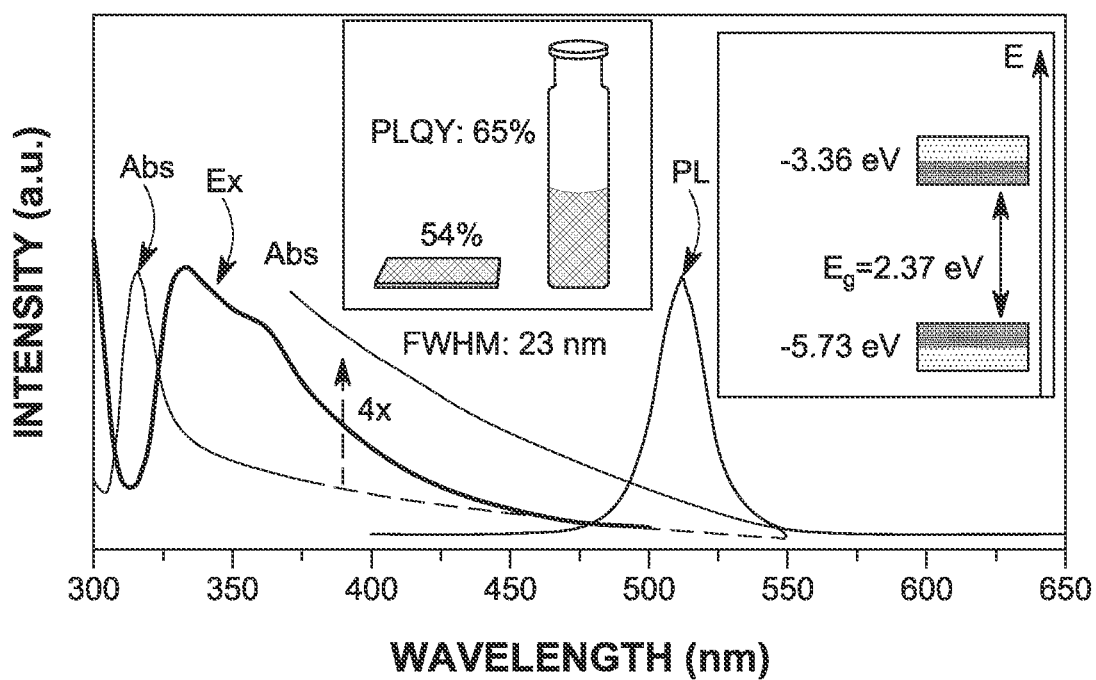
FIG. 12A shows steady-state absorption, excitation, photoluminescence spectra, and bandgap alignment of an embodiment of colloidal $Cs_4PbBr_6$ NSs; insets show a photograph of a thin-film sample and a colloidal sample under the illumination of a UV lamp with a 365 nm wavelength.
Figure 17A:
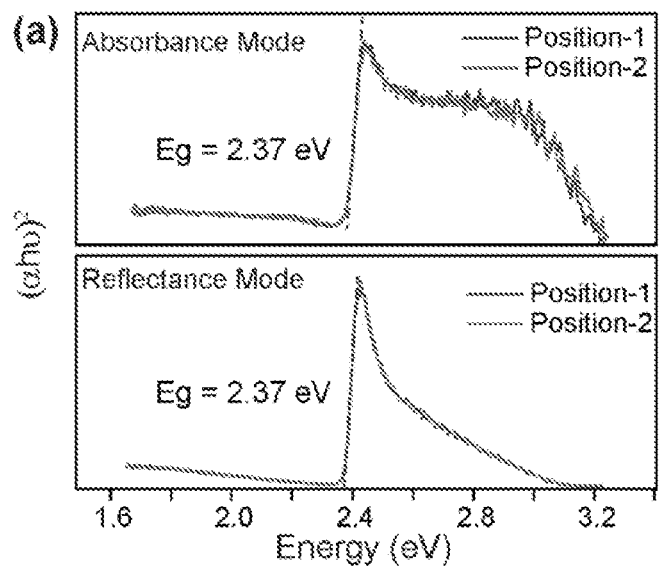
FIG. 17A demonstrates Tauc plots for absorption of an embodiment of a thin-film with $Cs_4PbBr_6$ NCs. Two position (1 and 2) on the film were measured in the absorbance mode and reflectance mode, respectively.
Figure 17B:
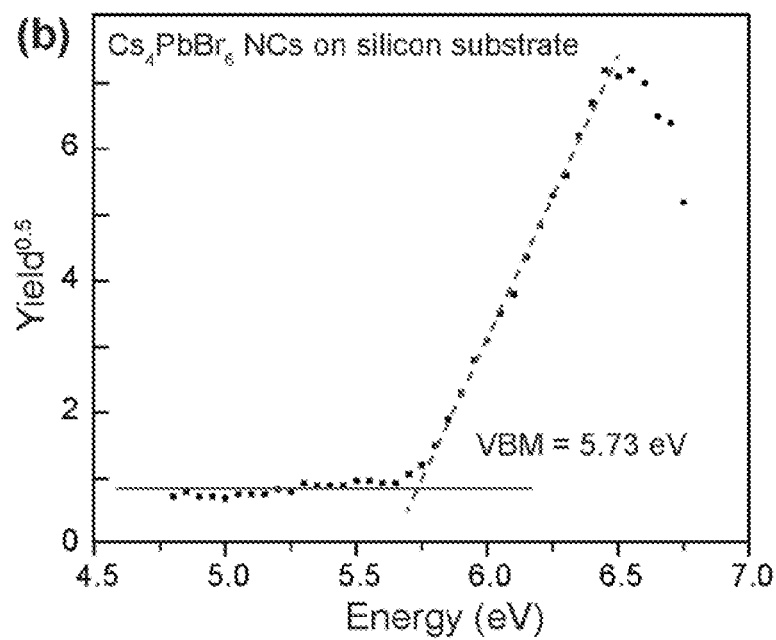
FIG. 17B illustrates Photo-Electron Spectroscopy in Air (PESA) measurements of an embodiment of $Cs_4PbBr_6$ NCs on a silicon substrate, indicating the valence band maximum located at −5.73 eV below vacuum level.

The optical properties of $Cs_4PbBr_6$ NCs were investigated by steady-state absorption, PL and reflectance spectroscopic techniques. The PL spectrum was centered at 515 nm with a standard Gaussian profile and a FWHM of 23 nm (FIG. 12A). The absorption spectrum of colloidal sample exhibits a strong peak at 315 nm and a long tail from 350 nm to 500 nm (FIG. 12A). The absorption at 315 nm stems from the $^1S_0 \rightarrow {}^3P_1$ transition of $Pb^{2+}$ centers, as has been reported by Nikl et.al [10-12]. It is worth noting that this peak was also observed in 3-D Perovskite $CsPbBr_3$ NCs (FIGS. 16A-16D). On the other hand, the long-tail absorption shows no peak feature in the range from 350 nm to 550 nm, making it challenging to find the absorption cutoff. In order to find the optical bandgap, reflectance spectroscopy equipped with integrating sphere was conducted for thin-film sample of $Cs_4PbBr_6$ NCs (FIG. 17A). Unlike the colloidal sample, the thin-film sample shows a sharp absorption cutoff at 523 nm (2.37 eV), which is in good agreement with the PL peak and previous reported values [7-13]. In an attempt to understand the bandgap alignment, we conduct photoelectron spectroscopy in air (PESA) and find a valence band maximum (VBM) at −5.73 eV (FIG. 17B). These data allow calculation of the conduction band minimum (CBM), therefore providing a clear picture of the band structure of this novel material (FIG. 12A, inset).

Figure 19A:
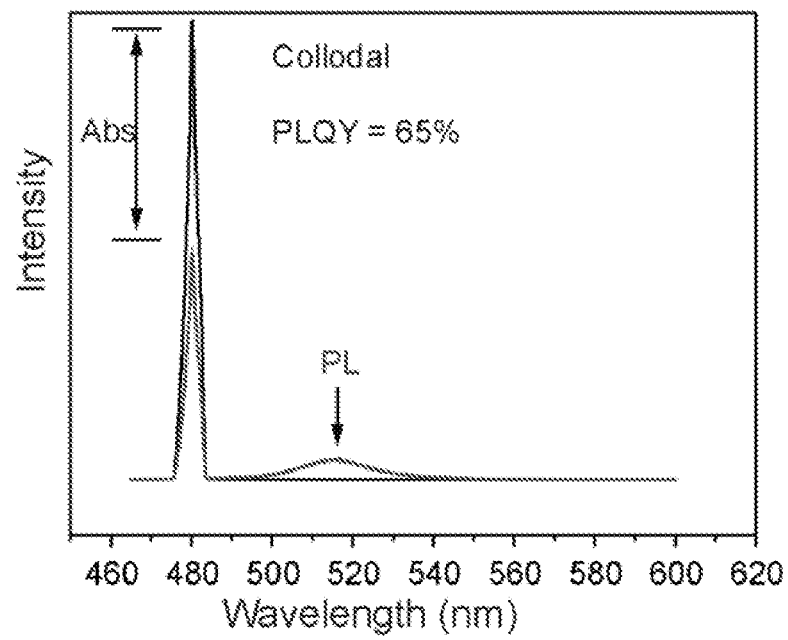
FIG. 19A shows the photoluminescence quantum yield (PLQY) measurements of an embodiment of colloidal $Cs_4PbBr_6$ NCs. The measurement was conducted in an integrated sphere with an excitation wavelength at 480 nm.
Figure 19B:
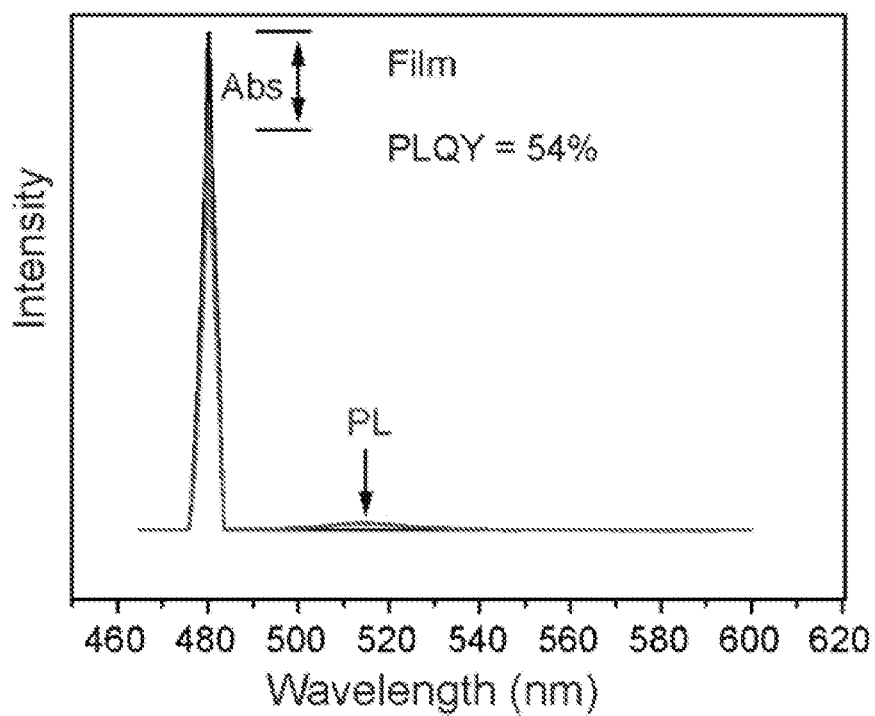
FIG. 19B shows the photoluminescence quantum yield (PLQY) measurements of an embodiment of thin-film $Cs_4PbBr_6$ NCs. The measurement was conducted in an integrated sphere with an excitation wavelength at 480 nm.

Recently, 0-D $Cs_4PbBr_6$ powders have demonstrated an exceptional PLQY of 45% [7,13,14]. However, there is no report on the performance of colloidal or thin-film of this novel material to the best of our knowledge. Here, a relatively high PLQY of 65% (excitation at 480 nm) from $Cs_4PbBr_6$ NCs colloidal sample is reported by the use of an integrating sphere (FIG. 12A, inset; FIG. 19A). This value is slightly lower than that (80-90%) of 3-D Perovskite $CsPbBr_3$ NCs colloidal [15-17]. However, it is more practical and important to compare their PLQY in thin-film form when considering their use in optoelectronic applications. For instance, PLQY of 3-D Perovskite $CsPbBr_3$ NCs dramatically decreased from 56% to 18% or even less when they are transformed from colloidal to thin-film due to the loss of ligands or aggregation [18]. Surprisingly, the $Cs_4PbBr_6$ NCs retained a record PLQY of 54% even after they are drop-casted into thin-film on a glass slide (FIG. 19B). Seemingly, the PLQY of 0-D perovskite is not sensitive to the nanocrystal environment, such as the solvent in colloidal and the air in thin-film, due to a high exciton binding energy (114 meV, vide infra).

Figure 12B:
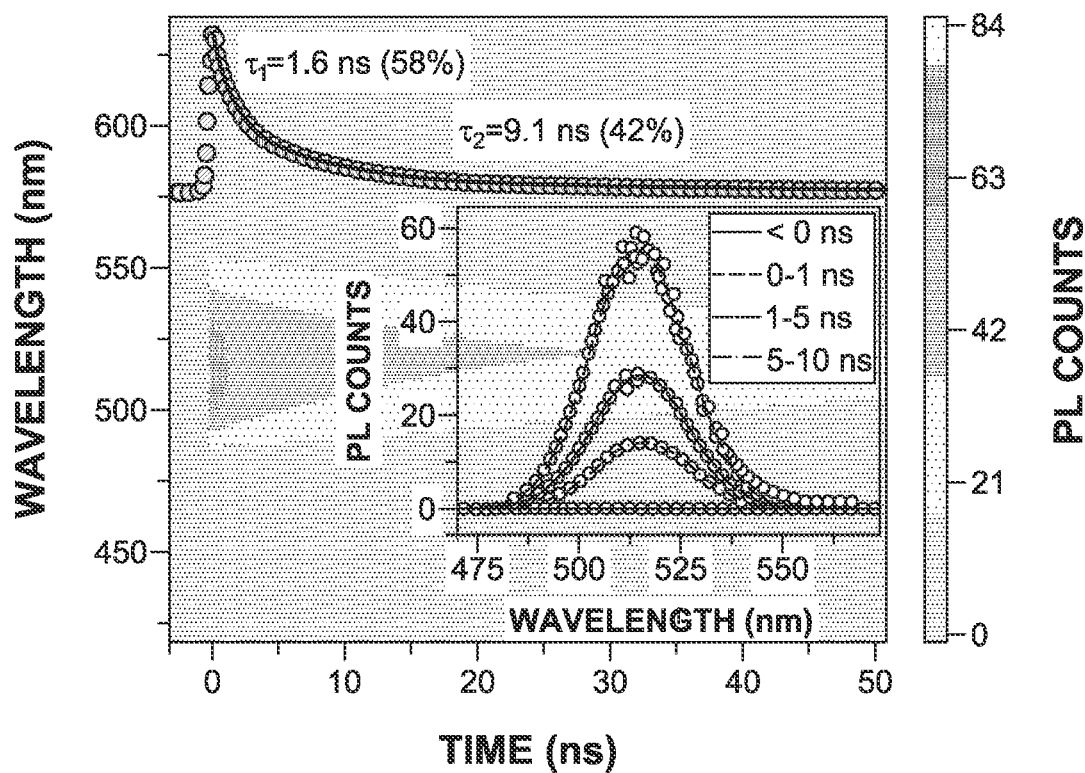
FIG. 12B is a streak camera image showing two decay components involving in exciton recombination process in an embodiment of colloidal $Cs_4PbBr_6$ NCs; the inset shows the transient PL spectra at different time delays as indicated in the figure.
Figure 20:
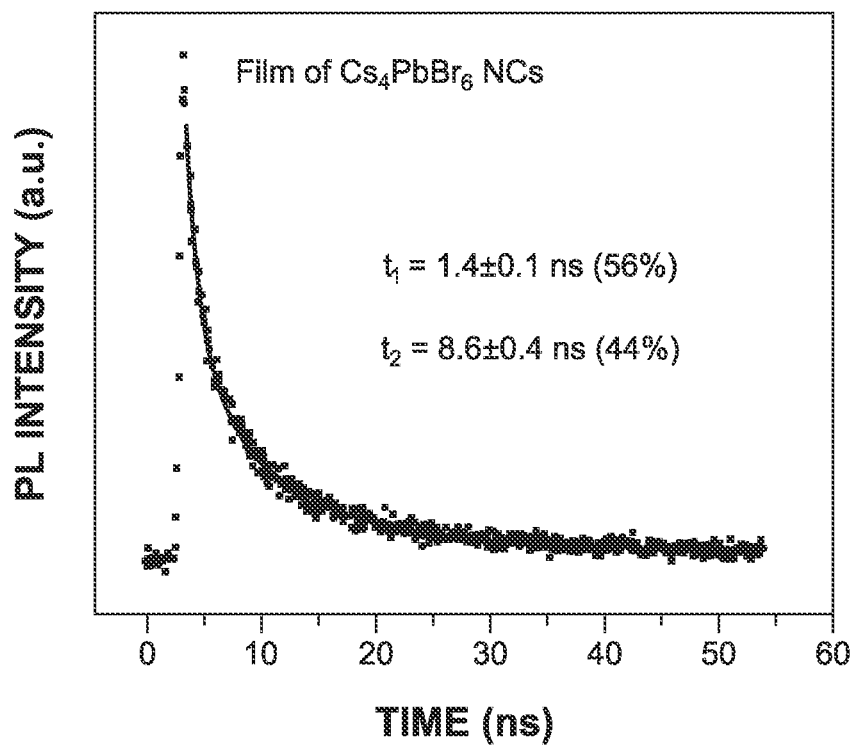
FIG. 20 shows the PL lifetime measurement of an embodiment of a thin-film sample of $Cs_4PbBr_6$ NCs, showing values close to that an embodiment of a colloidal counterpart.

To understand the dynamics of exciton recombination, streak camera[s] were used to record the PL decay of both thin-film and colloidal samples of $Cs_4PbBr_6$ NCs (FIG. 12B). The colloidal sample shows a bi-component decay profile with a short lifetime of 1.6 ns and a long lifetime of 9.1 ns. The short and long components can be ascribed to the excitons located on the surface and interior of the $Cs_4PbBr_6$ NCs, respectively [19]. PL peak position is not changing with time, indicating that different migration and recombination mechanisms are not rising within time (FIG. 12B, inset). Importantly, time-resolved PL measurement of thin-film sample reveals an essentially unaltered lifetime with a short component about 1.4 ns and a long component about 8.6 ns (FIG. 20), confirming that the exciton recombination is not sensitive to nanocrystal environment.

Figure 13A:
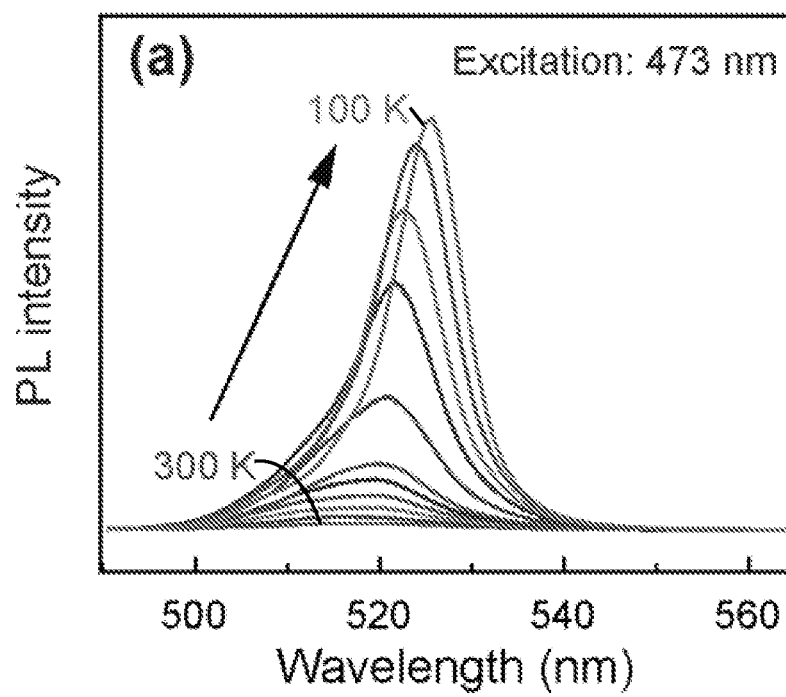
FIG. 13A depicts a temperature-dependent PL spectra of an embodiment of a $Cs_4PbBr_6$ NC thin film.
Figure 13B:
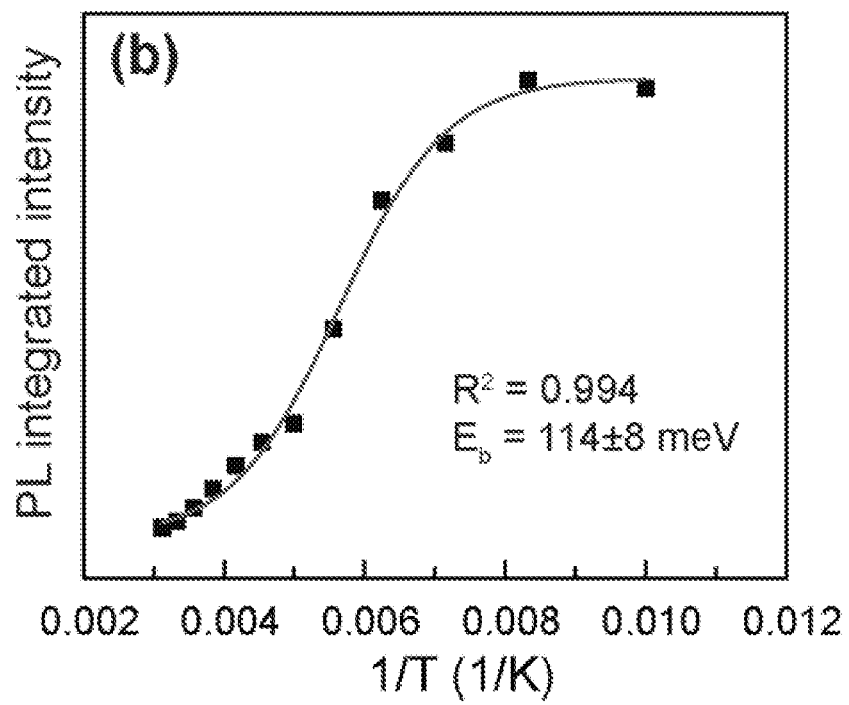
FIG. 13B shows the PL integrated intensity of FIG. 13A.

To shed more light on the exciton nature of $Cs_4PbBr_6$ NCs, temperature-dependent PL measurement was conducted for the thin-film sample (FIG. 13A). The PL integrated intensity was plotted against temperature and fitted with the following equation [17]:

$$I(T) = \frac{I_0}{1 + Ae^{E_b/(k_BT)}}$$

where I(T) and $I_0$ are the integrated PL intensity at temperature T and 0 K, respectively. $E_b$ is the exciton binding energy, and $k_B$ is the Boltzmann constant. The fitting yields an exciton binding energy of 114±8 meV (FIG. 13B), which is much high than that (40 meV) of 3-D $CsPbBr_3$ NCs. Such tightly bound excitons are not likely to diffuse in crystal lattice, instead, they are localized in a single unit cell. We propose that the excitons in $Cs_4PbBr_6$ NCs are more likely a kind of Frenkel excitons rather than Wannier-Mott excitons [20]. The localized nature of exciton could be the reason that the PLQY of $Cs_4PbBr_6$ NCs are not sensitive to surrounding environments such as solvent in colloidal or air in thin-film.

Figure 13C:
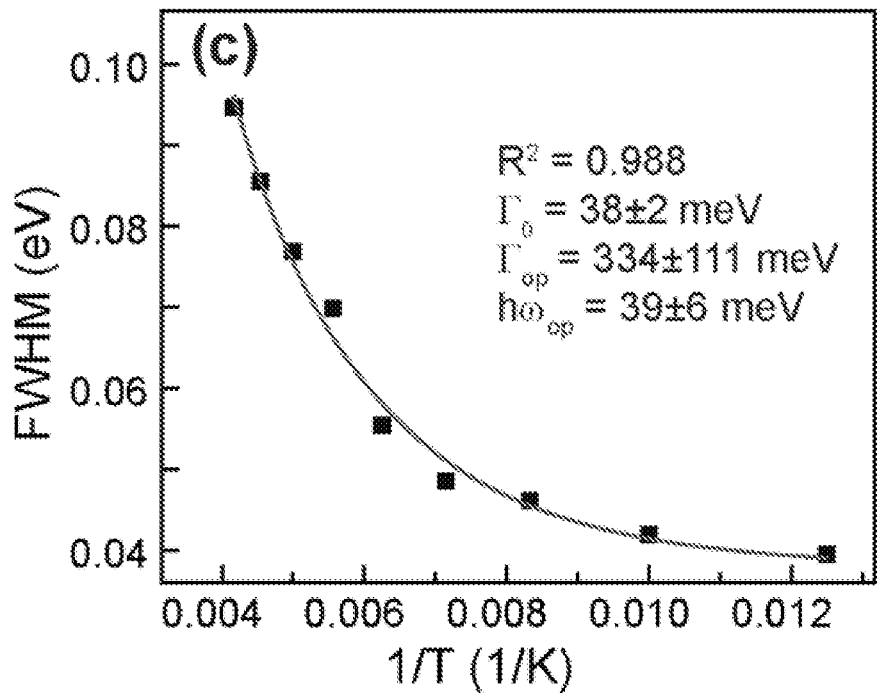
FIG. 13C shows the full-width half-maximum of PL bands.
Figure 13D:
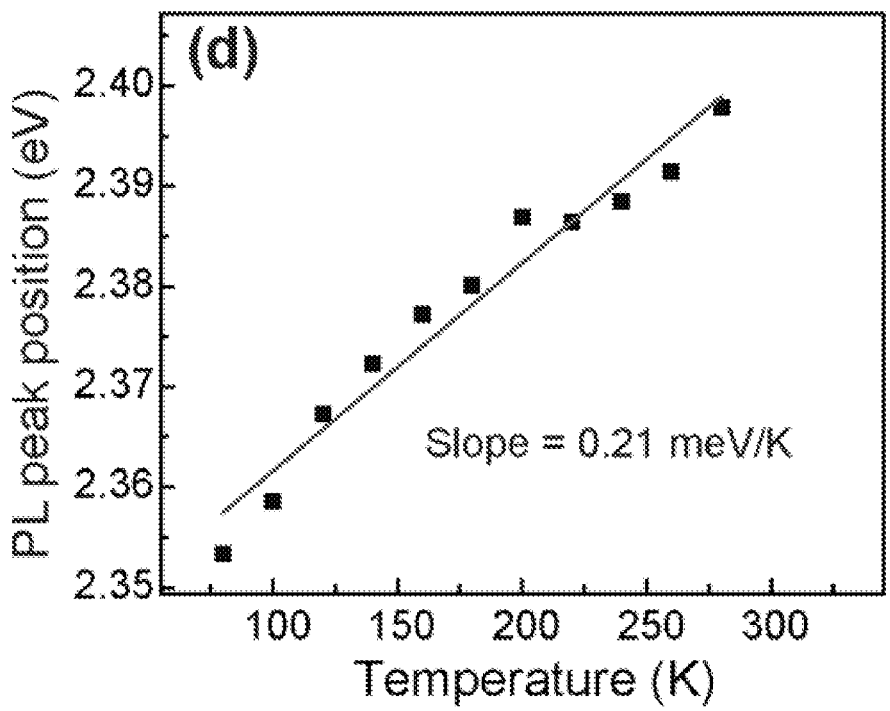
FIG. 13D demonstrates PL peak position as a function of temperatures.

Along with the decrease of PL intensity, we also observed an increase of FWHM with increasing temperature (FIG. 13C). Such peak broadening can be ascribed to the exciton-phonon interaction, which is described by the following Boson model [7]:

$$\Gamma(T) = \Gamma_0 + \sigma T + \frac{\Gamma_{op}}{e^{\hbar\omega_{op}/k_BT} - 1}$$

where $\Gamma(T)$ is the FWHM energy at temperature T, $\Gamma_0$ is the inhomogeneous broadening contribution, $\sigma$ and $\Gamma_{op}$ are the interactions of exciton-acoustic phonon and exciton-optical phonon contributing to broadening, respectively. Because optical phonon is dominant in emission broadening, σ was set as zero when we fit the model [7]. The fitting yields an optical phonon energy ($\hbar\omega_{op}$) of 39 meV, which is perfectly consistent with the Raman vibrational energy (314 $cm^{-1}$, 39 meV) of $Cs_4PbBr_6$ as reported before [7]. It is worth mentioning that such observed blue-shift in the PL spectra with increasing temperature (FIG. 13D) has also been reported in several semiconductors NCs including PbS, $CsPbBr_3$, and $CH_3NH_3PbX_3$ [16,17,21]. It is very likely that thermal activation effect on states of CBM leads to the PL blue-shift [7].

Figure 14A:
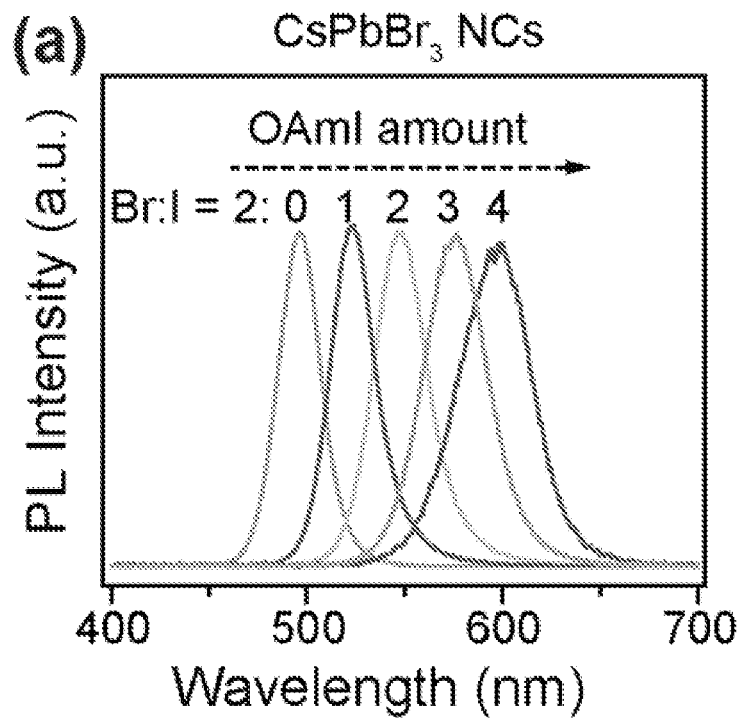
FIG. 14A shows the PL spectra evolution induced by anion exchange of an embodiment of 3-D perovskite $CsPbBr_3$ NCs.
Figure 14B:
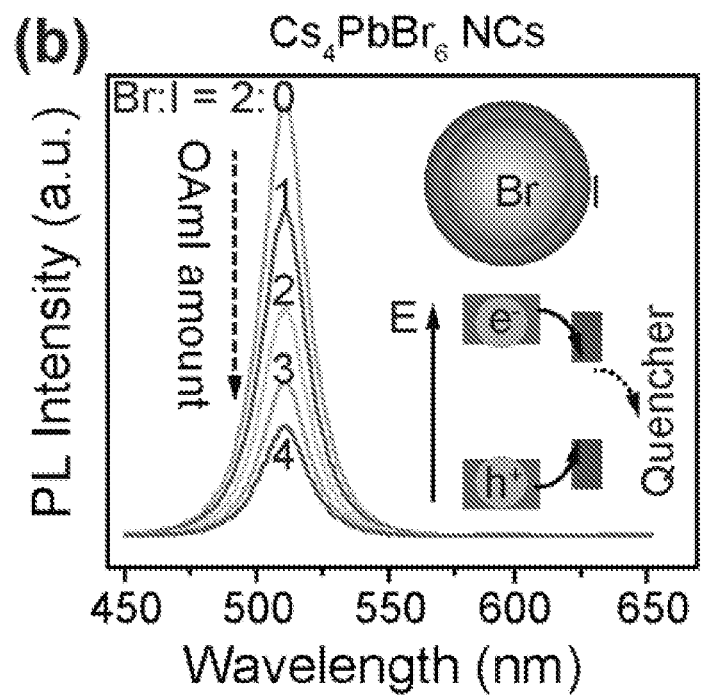
FIG. 14B shows the PL spectra evolution induced by anion exchange of an embodiment of 3-D Perovskite $Cs_4PbBr_6$ NCs. Note that in both FIGS. 14A and 14B OAmI was used as an iodine precursor for anion exchange in toluene environment. The inset schematic shows the core/shell structure of $Cs_4PbBr_6/Cs_4PbI_6$ and a proposed dissipation process of excitons.
Figure 15:
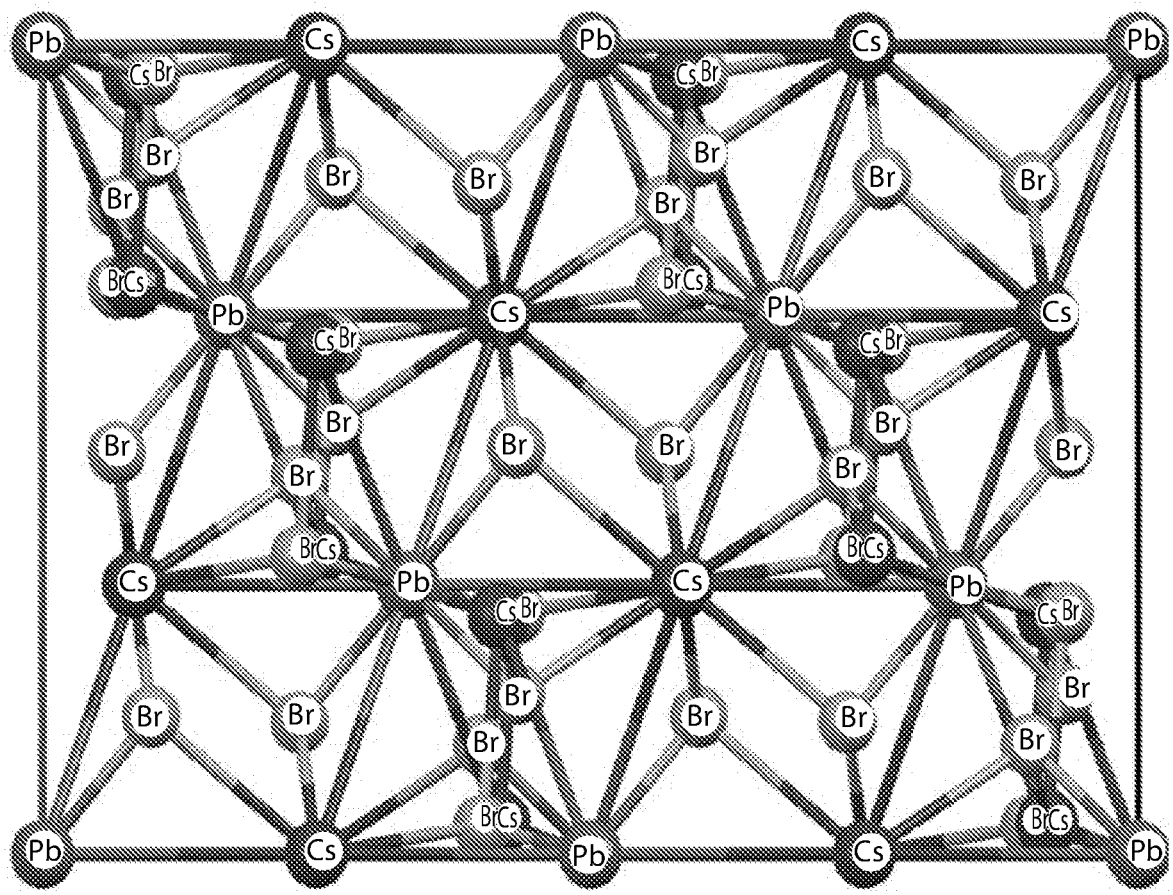
FIG. 15 is a schematic showing an embodiment of the crystal structure of $Cs_4PbBr_6$ NCs. Every single $PbBr_6^{4-}$ octahedra was isolated by 4 Cs+ ions from neighboring $PbBr_6^{4-}$ octahedrons, making a perfect 0 dimensional perovskite crystal lattice.
Figure 16A:
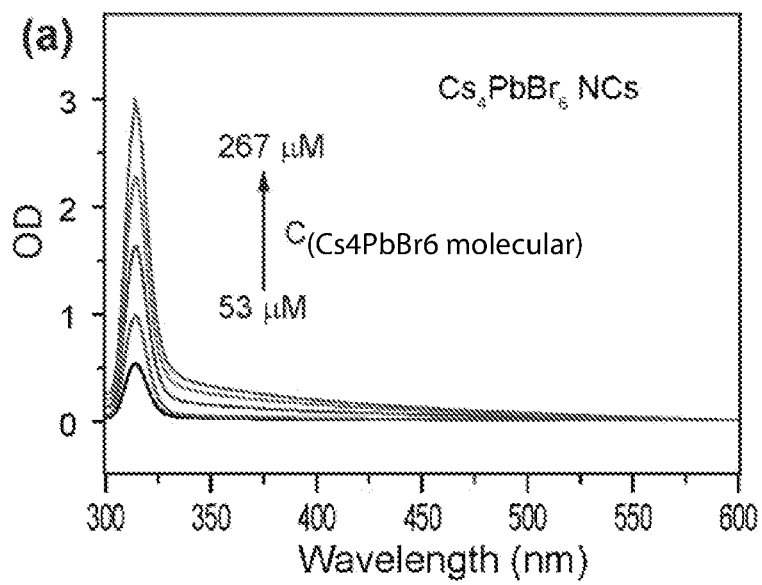
FIG. 16A illustrates absorption spectra of an embodiment of $Cs_4PbBr_6$ NCs as a function of concentration in terms of monomers.
Figure 16B:
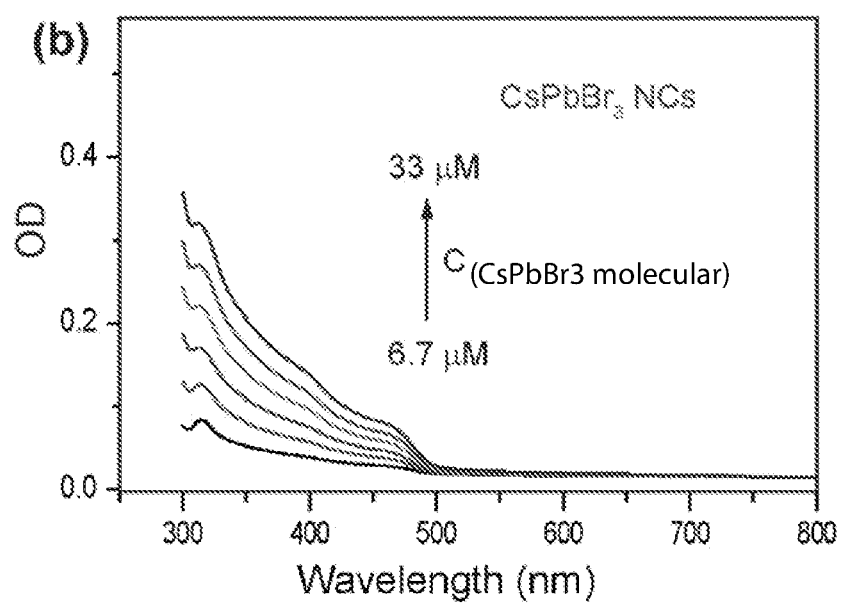
FIG. 16B illustrates absorption spectra of an embodiment of $CsPbBr_3$ NCs as a function of concentration in terms of monomers.
Figures 16C, 16D:
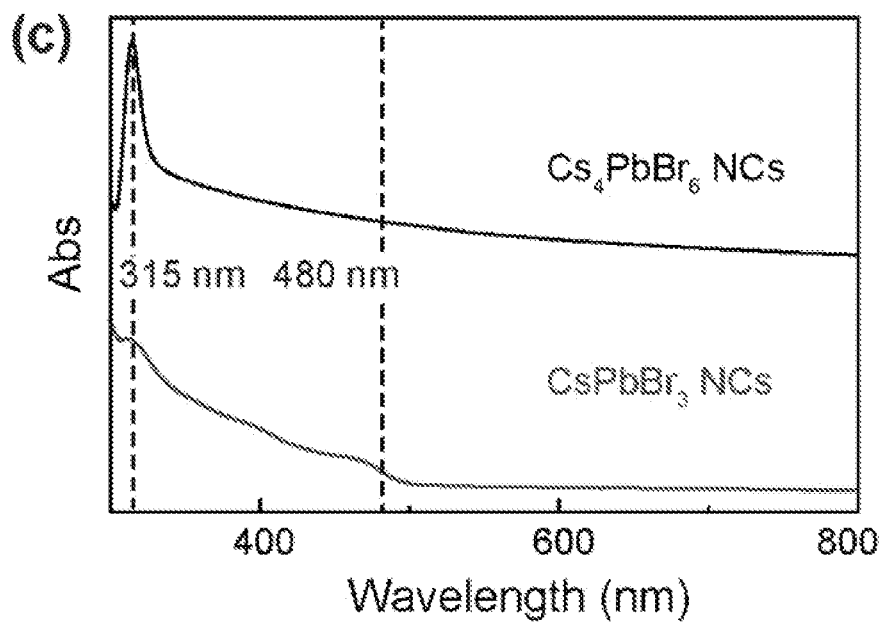
FIG. 16C shows the absorption spectra of embodiments of $Cs_4PbBr_6$ NCs and $CsPbBr_3$ NCs shows a common absorption peak at 315 nm, indicating that this transition may stem from $Pb^{2+}$ ions.
FIG. 16D shows molar absorption coefficients calculated based on the absorption data in FIGS. 16A and 16B.
Figure 21:
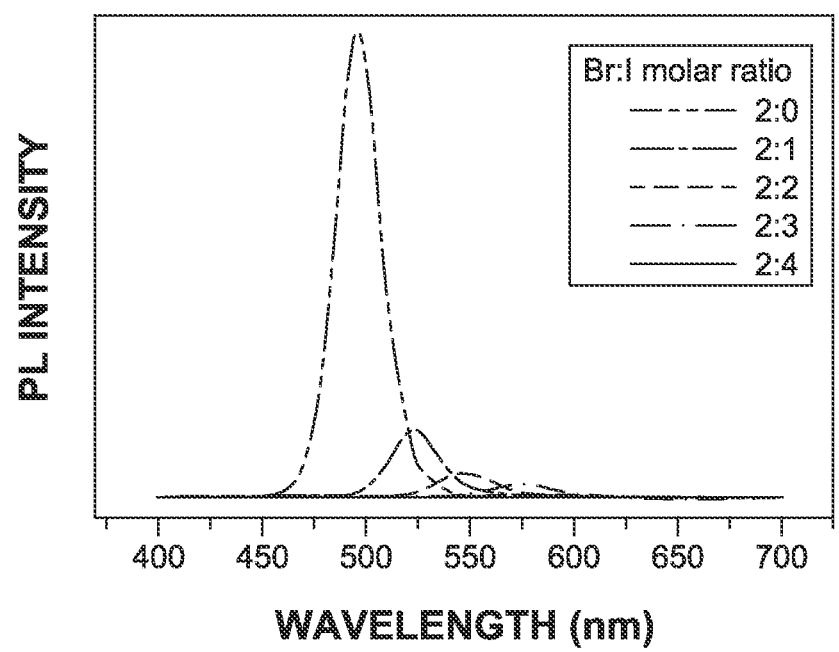
FIG. 21 illustrates the PL spectral evolution of an embodiment of colloidal $CsPbBr_3$ NCs upon the addition of an iodine precursor (OAmI).

Due to the high ionic conductivity in lead halide perovskite crystals [22], fast anion exchange reaction become a facile tool to tune the bandgap of perovskite NCs and polycrystalline thin-films [15,23,24]. FIG. 14A shows the anion exchange reaction of 3-D Perovskite $CsPbBr_3$ NCs in the presence of an iodine precursor of oleylamine iodide (OAmI) [15]. As can be seen, the PL peak displays a remarked red-shift from 490 nm to 605 nm upon the addition of OAmI (FIG. 21). On the other hand, such labile nature of perovskite-based emissive layer poses a severe constrain on stable output of LEDs [25,26]. In stark contrast, under the same experimental conditions, the PL peak position of $Cs_4PbBr_6$ NCs remains unaltered at 515 nm (FIG. 14B), showing a robust resistance to anion exchange reaction. Such resistance can be explained by the fact that in 0-D crystal structure of $Cs_4PbBr_6$ NCs, every single $PbBr_6^{4-}$ octahedron was caged and isolated by CsBr bridges (FIG. 15). Iodine ions need to break Cs—Br bond to get access to the caged PbBr$_6^{4-}$ octahedron. However, the dissociation energy of Cs—Br bond (389.1 kJ·mol$^{-1}$) is much higher than that of Pb—Br bond (248.5 kJ·mol$^{-1}$) [27], which hinders iodine to access the interior of Cs$_4$PbBr$_6$ NCs. The surface Br moiety could be partially exchanged by iodine, forming a monolayer of Cs$_4$PbI$_6$ shell lattice. Such core/shell structure is a typical semiconductor heterostructure of reverse type I, which facilitates the energy transfer from interior excitons to surface quenchers [28]. Indeed, a PL decrease was observed upon adding iodine precursors (FIG. 14B).

In conclusion, reported herein is a reverse microemulsion method for the first time to synthesize highly luminescent 0-D Cs$_4$PbBr$_6$ NCs. The thin-films based on the 0-D NCs exhibit an exceptional high PLQY (54%) which can be considered as one of highest values reported so far for semiconductor NCs in solid form, making them an excellent candidate for emissive layer in phosphor and LED applications. Additionally, the robust resistance of Cs$_4$PbBr$_6$ NCs to anion exchange was demonstrated, which allows the formation of heterojunctions without alloying issues. Suggested method of NCs synthesis can be extended to all other Zero-D Perovskites materials. Also by changing solvent-solvent pair and reactants/ligand ratio it is possible to tune NCs particle size from small (2 nm) to large (200 nm) sizes.

This work opens many possibilities to the design and practical use of a perovskite nanocrystal with new 0-D phase, especially in solution-processed fabrication of optoelectronics devices where the layers of luminescent materials are deposited by drop casting, blade casting, spin coating from stable colloidal solutions.

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figure of the numerical value. In addition, the phrase "about 'x' to 'y'" includes "about 'x' to about 'y'".

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

REFERENCES

[1] Phosphors, Up Conversion Nano Particles, Quantum Dots and Their Applications, Volume 2, ed. R-H. Liu. Springer Science+Business Media Singapore 2016.

[2] Colloidal Quantum Dot Optoelectronics and Photovoltaics, eds. G. Konstantatos and E. H. Sargent. Cambridge University Press, 2013.

[3] M. I. Saidaminov, J. Almutlaq, S. P. Sarmah, I. Dursun, A. A. Zhumekenov, R. Begum, J. Pan, N. Cho, O. F. Mohammed, O. M. Bakr. Pure Cs$_4$PbBr$_6$: Highly Luminescent Zero-Dimensional Perovskite Solids. ACS Energy Lett., 2016, 1, 840.

[4] Lee, B.; Stoumpos, C. C.; Zhou, N.; Hao, F.; Malliakas, C.; Yeh, C.-Y.; Marks, T. J.; Kanatzidis, M. G.; Chang, R. P. H. Air-Stable Molecular Semiconducting Iodosalts for Solar Cell Applications: Cs$_2$SnI$_6$ as a Hole Conductor. J. Am. Chem. Soc. 2014, 136 (43), 15379.

[5] M. M. Adachi, F. Fan, D. P. Sellan, S. Hoogland, O. Voznyy, A. J. Houtepen, K. D. Parrish, P. Kanjanaboos, J. A. Malen and E. H. Sargent. Microsecond-sustained lasing from colloidal quantum dot solids. Nature communication, 2015, 6.

[6] Krames, M. R.; Shchekin, O. B.; Mueller-Mach, R.; Mueller, G.; Zhou, L.; Harbers, G.; Craford, M. G. Status and Future of High-Power Light-Emitting Diodes for Solid-State Lighting J. Disp. Technol. 2007, 3, 160-175, DOI: 10.1109/JDT.2007.895339

[7] Chen, D.; Wan, Z.; Chen, X.; Yuan, Y.; Zhong, J. J. Mater. Chem. C 2016, 4, 10646-10653.

[8] Zarur, A. J.; Ying, J. Y. nature 2000, 403, 65-67.

[9] Yang, Y.; Jing, L.; Yu, X.; Yan, D.; Gao, M. Chem. Mater. 2007, 19, 4123-4128.

[10] Kondo, S.; Amaya, K.; Saito, T. J. Phys.: Condens. Matter 2002, 14, 2093-2099.

[11] Nikl, M.; Nitsch, K.; Chval, J.; Somma, F.; Phani, A.; Santucci, S.; Giampaolo, C.; Fabeni, P.; Pazzi, G.; Feng, X. J. Phys.: Condens. Matter 2000, 12, 1939.

[12] Nikl, M.; Nitsch, K.; Mihokova, E.; Polak, K.; Fabeni, P.; Pazzi, G.; Gurioli, M.; Phani, R.; Santucci, S.; Scacco, A. Radiat. Eff. Defects Solids 1999, 150, 341-345.

[13] Saidaminov, M. I.; Almutlaq, J.; Sarmah, S.; Dursun, I.; Zhumekenov, A. A.; Begum, R.; Pan, J.; Cho, N.; Mohammed, O. F.; Bakr, O. M. ACS Energy Lett. 2016, 1, 840-845.

[14] Rakita, Y.; Kedem, N.; Gupta, S.; Sadhanala, A.; Kalchenko, V.; Böhm, M. L.; Kulbak, M.; Friend, R. H.; Cahen, D.; Hodes, G. Cryst. Growth Des. 2016, 16, 5717-5725.

[15] Nedelcu, G.; Protesescu, L.; Yakunin, S.; Bodnarchuk, M. I.; Grotevent, M. J.; Kovalenko, M. V. Nano Lett. 2015, 15, 5635-40.

[16] Zhang, F.; Zhong, H.; Chen, C.; Wu, X.-g.; Hu, X.; Huang, H.; Han, J.; Zou, B.; Dong, Y. ACS Nano 2015, 9, 4533-4542.

[17] Li, X. M.; Wu, Y.; Zhang, S. L.; Cai, B.; Gu, Y.; Song, J. Z.; Zeng, H. B. Adv. Funct. Mater. 2016, 26, 2435-2445.

[18] Kim, Y.; Yassitepe, E.; Voznyy, O.; Comin, R.; Walters, G.; Gong, X.; Kanjanaboos, P.; Nogueira, A. F.; Sargent, E. H. ACS Appl. Mater. Interfaces 2015, 7, 25007-25013.

[19] Makarov, N. S.; Guo, S.; Isaienko, O.; Liu, W.; Robel, I.; Klimov, V. I. Nano Lett. 2016, 16, 2349-2362.

[20] Scholes, G. D.; Rumbles, G. Nat. Mater. 2006, 5, 683-696.

[21] Dey, P.; Paul, J.; Bylsma, J.; Karaiskaj, D.; Luther, J.; Beard, M.; Romero, A. Solid State Commun. 2013, 165, 49-54.

[22] Mizusaki, J.; Arai, K.; Fueki, K. Solid State Ionics 1983, 11, 203-211.

[23] Akkerman, Q. A.; D'Innocenzo, V.; Accornero, S.; Scarpellini, A.; Petrozza, A.; Prato, M.; Manna, L. J. Am. Chem. Soc. 2015, 137, 10276-10281.

[24] Hoffman, J. B.; Schleper, A. L.; Kamat, P. V. J. Am. Chem. Soc. 2016, 138, 8603-8611.

[25] Meyns, M.; Perálvarez, M.; Heuer-Jungemann, A.; Hertog, W.; Ibáñez, M.; Nafria, R.; Genç, A.; Arbiol, J.; Kovalenko, M. V.; Carreras, J. ACS Appl. Mater. Interfaces 2016, 8, 19579-19586.

[26] Palazon, F.; Di Stasio, F.; Akkerman, Q. A.; Krahne, R.; Prato, M.; Manna, L. Chem. Mater. 2016, 28, 2902-2906.

[27] Luo, Y.-R., Comprehensive handbook of chemical bond energies. CRC press: 2007.

[28] Battaglia, D.; Li, J. J.; Wang, Y.; Peng, X. Angew. Chem. Int. Ed. 2003, 42, 5035-5039.

Therefore, the following is claimed:

1. A composite material, comprising:
Zero-D Perovskite particles encapsulated in a polymer, wherein the material absorbs a first wavelength of light and emits light with a second wavelength, wherein the second wavelength is longer than the first,
wherein the Zero-D Perovskites particles have a size of about 2 nm to about 200 nm and are capped by ligands.

2. The composite material of claim 1, wherein the polymer is selected from the group consisting of: polyurethanes, latex rubbers, silicone rubbers, other rubbers, polyvinylchloride (PVC), vinyl polymers, polyesters, polyacrylates, polyamides, biopolymers, polyolefines, thermoplastic elastomers, styrene block copolymers, and polyether block amide.

3. The composite material of claim 1, wherein the Zero-D Perovskite particles are of the formula $A_4BX_6$, wherein A is a monovalent organic cation, an inorganic cation, or mixtures thereof; wherein B is a divalent cation; and X is $Cl^-$, $Br^-$, $I^-$, $CH_3COO^-$, or mixtures thereof.

4. The composite material of claim 3, wherein A is $Cs^+$, $Rb^+$, $CH_3NH_3^+$, or $HC(NH_2)_{2+}$.

5. The composite material of claim 3, wherein B is $Pb^{2+}$, $Sn^{2+}$, or $Ge^{2+}$.

6. The composite material of claim 1, wherein a Zero-D Perovskite formula: $A_3B_2X_9$, wherein A is a monovalent organic cation, an inorganic cation, or mixtures thereof; B is a trivalent cation; and X is $Cl^-$, $Br^-$, $I^-$, $CH_3COO^-$ or mixtures thereof.

7. The composite material of claim 6, wherein A is $Cs^+$, $Rb^+$, $CH_3NH_3^+$, or $HC(NH_2)_2^+$.

8. The composite material of claim 6, wherein B is $Bi^{3+}$ or $Sb^{3+}$.

9. The composite material of claim 1, wherein a Zero-D Perovskite formula: $A_2BX_6$, where A is a monovalent organic cation, an inorganic cation, or mixtures thereof; B is a tetravalent cation; and X is $Cl^-$, $Br^-$, $I^-$, $CH_3COO^-$ or mixtures thereof.

10. The composite material of claim 9, wherein A is $Cs^+$, $Rb^+$, $CH_3NH_3^+$, or $HC(NH_2)_2^+$.

11. The composite material of claim 9, wherein B is $Sn^{4+}$.

12. The composite material of claim 1, wherein the ligands are selected from the group consisting of: long chain carboxylic acids, carboxylates, trioctylphosphines, trioctylphosphine oxides, amines, thiols, sulfates, sulfonates, and phosphates.

13. The composite material of claim 1, wherein the Zero-D Perovskite particles emit light with FWHM of less than 25 nm and PLQY of the composite material is more than 40%.

14. The composite material of claim 1, further comprising a Rare-Earth activated Phosphor encapsulated in the polymer.

15. The composite material of claim 14, wherein the Rare-Earth activated Phosphor is selected from the group comprising: oxides, nitrides, oxynitrides, sulfides, oxysulfides, selenides, halides, oxyhalides, silicates, aluminates, fluoride, phosphates, garnets and scheelites containinq cerium, dysprosium, erbium, europium, gadolinium, holmium, lanthanum, lutetium, neodymium, praseodymium, promethium, samarium, scandium, terbium, thulium, ytterbium and yttrium.

16. The composite material of claim 1, further comprising Quantum Dots encapsulated in the polymer.

17. The composite material of claim 16, wherein the Quantum Dots are selected from the group comprising: CdSe, CdSe/ZnS, CdSe/ZnSe, CdSe/CdS, InP, InP/ZnS, InP/ZnSe, PbS, PbSe, CdTe, CdTe/ZnS, CdTe/CdSe, and $ABX_3$ (where A is $Cs^+$, $Rb^+$, $CH_3NH_3^+$, $HC(NH_2)_2^+$ or mixtures thereof, B is $Pb^{2+}$, $Sn^{2+}$, or $Ge^{2+}$, X is $Cl^-$, $Br^-$, $I^-$ or mixtures thereof).

18. The composite material of claim 1, wherein the composite material is a thin film.

19. A method of forming a composite material, the method comprising:
encapsulating zero-dimensional perovskite particles in a polymer, wherein the composite material absorbs a first wavelength of light and emits light with a second wavelength, wherein the second wavelength is longer than the first,
wherein the zero-dimensional perovskites particles have a size of about 2 nm to about 200 nm and are capped by ligands.

20. A composite material, comprising:
Zero-D Perovskite particles encapsulated in a polymer, wherein the material absorbs a first wavelength of light and emits light with a second wavelength, wherein the second wavelength is longer than the first; and
Quantum Dots encapsulated in the polymer.

* * * * *